United States Patent
Chen et al.

(10) Patent No.: US 12,432,927 B2
(45) Date of Patent: Sep. 30, 2025

(54) SEMICONDUCTOR DEVICES, SYSTEMS, AND METHODS FOR FORMING THE SAME

(71) Applicant: YANGTZE MEMORY TECHNOLOGIES CO., LTD., Wuhan (CN)

(72) Inventors: Liang Chen, Wuhan (CN); Wei Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 1043 days.

(21) Appl. No.: 17/483,086

(22) Filed: Sep. 23, 2021

(65) Prior Publication Data
US 2023/0048644 A1   Feb. 16, 2023

Related U.S. Application Data

(63) Continuation of application No. PCT/CN2021/111941, filed on Aug. 11, 2021.

(51) Int. Cl.
| | |
|---|---|
| *H01L 27/11573* | (2017.01) |
| *H01L 23/00* | (2006.01) |
| *H01L 25/065* | (2023.01) |
| *H01L 25/18* | (2023.01) |
| *H10B 41/41* | (2023.01) |
| *H10B 43/40* | (2023.01) |

(52) U.S. Cl.
CPC ............ *H10B 43/40* (2023.02); *H01L 24/08* (2013.01); *H01L 25/0657* (2013.01); *H01L 25/18* (2013.01); *H10B 41/41* (2023.02); *H01L 2224/08145* (2013.01); *H01L 2924/1431* (2013.01); *H01L 2924/14511* (2013.01)

(58) Field of Classification Search
None
See application file for complete search history.

(56) References Cited

U.S. PATENT DOCUMENTS

| | | |
|---|---|---|
| 2013/0248974 A1 | 9/2013 | Alsmeier et al. |
| 2015/0263136 A1 | 9/2015 | Hsiao et al. |
| 2015/0348849 A1 | 12/2015 | Flachowsky et al. |
| 2020/0006371 A1* | 1/2020 | Huo ............... H10B 41/35 |
| 2020/0350320 A1 | 11/2020 | Cheng et al. |
| 2020/0381420 A1* | 12/2020 | Chen ............... H10D 84/811 |

FOREIGN PATENT DOCUMENTS

| | | |
|---|---|---|
| CN | 103000518 A | 3/2013 |
| CN | 110506334 A | 11/2019 |
| CN | 110729288 A | 1/2020 |

(Continued)

OTHER PUBLICATIONS

International Search Report issued in corresponding International Application No. PCT/CN2021/111941, mailed May 7, 2022, 4 pages.

*Primary Examiner* — William C Trapanese
(74) *Attorney, Agent, or Firm* — BAYES PLLC

(57) ABSTRACT

In certain aspects, a semiconductor device includes a substrate, a first trench isolation in the substrate, a second trench isolation in the substrate and surrounding a portion of the substrate, and a first routing electrode layer extending through the first trench isolation. The portion of the substrate is an active region of a transistor.

20 Claims, 21 Drawing Sheets

(56) References Cited

FOREIGN PATENT DOCUMENTS

| | | | |
|---|---|---|---|
| CN | 110914987 | A | 3/2020 |
| CN | 110970347 | A | 4/2020 |
| CN | 112018069 | A | 12/2020 |
| CN | 113130394 | A | 7/2021 |
| KR | 20020091982 | A | 12/2002 |

* cited by examiner

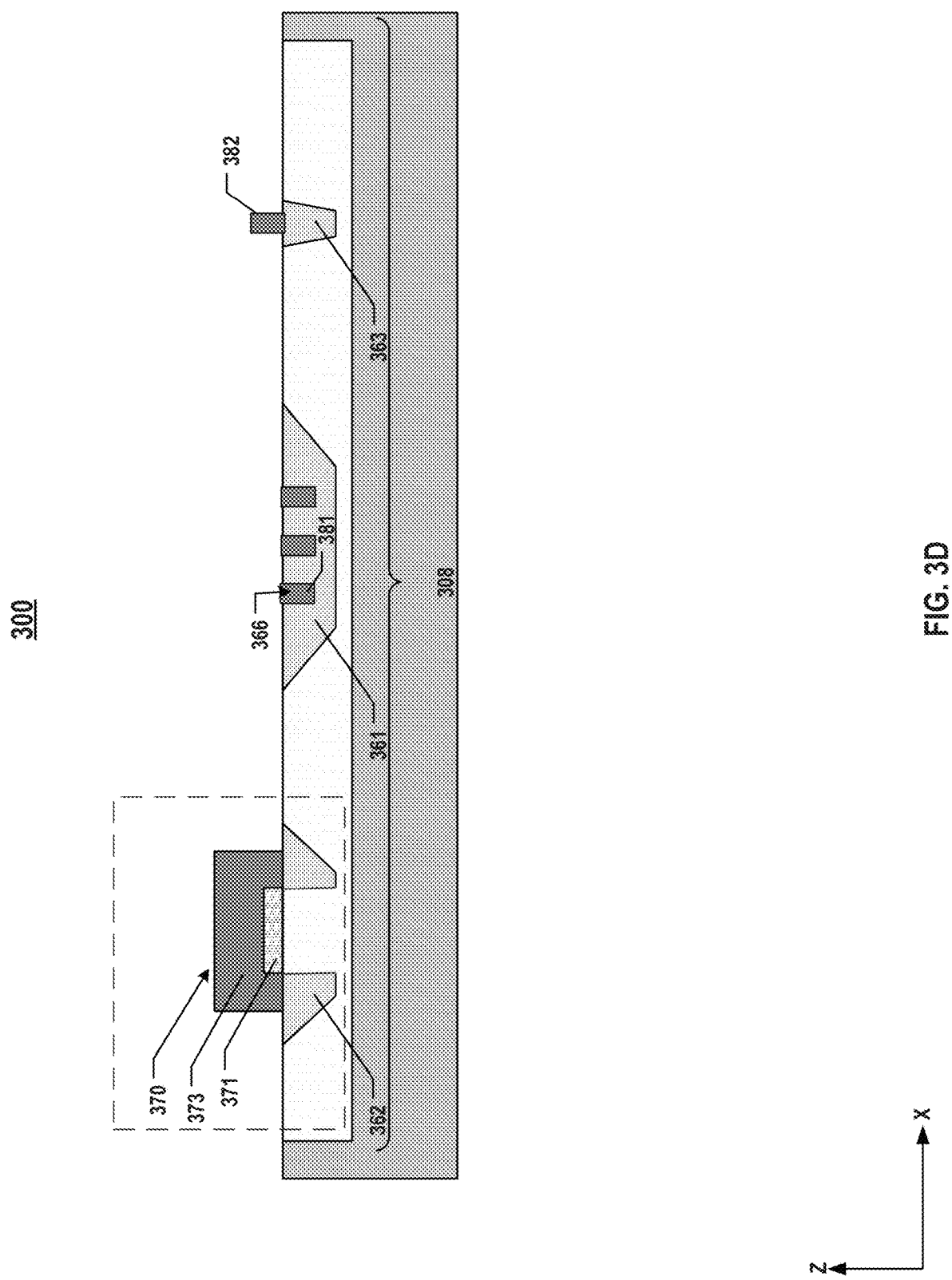

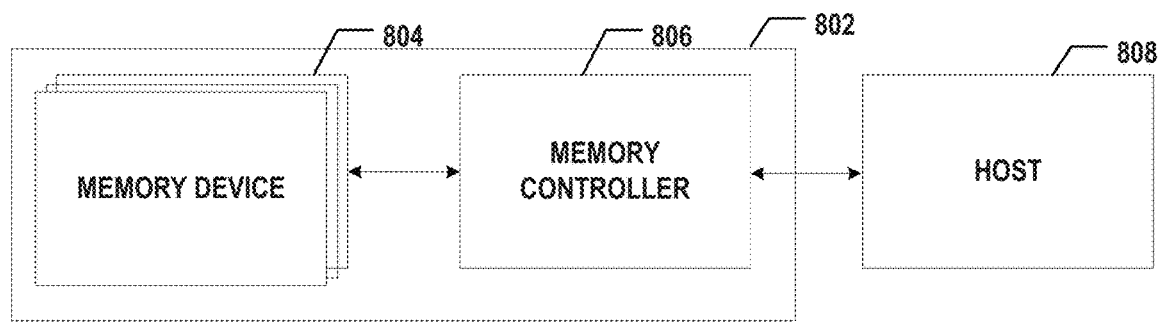
FIG. 8
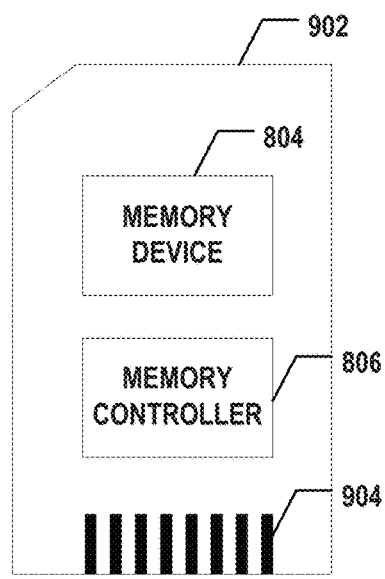
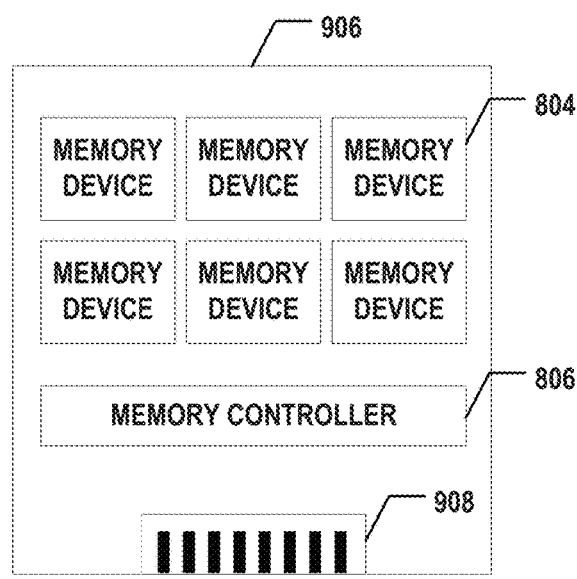
FIG. 9A
FIG. 9B

SEMICONDUCTOR DEVICES, SYSTEMS, AND METHODS FOR FORMING THE SAME

CROSS-REFERENCE TO RELATED APPLICATIONS

This application is continuation of International Application No. PCT/CN2021/111941, filed on Aug. 11, 2021, entitled "SEMICONDUCTOR DEVICES, SYSTEMS, AND METHODS FOR FORMING THE SAME," which is hereby incorporated by reference in its entirety.

BACKGROUND

The present disclosure relates to semiconductor devices, systems, and fabrication methods thereof.

Metal routing techniques are used to connect multiple semiconductor devices (e.g., transistors or memory devices) among circuits. However, as more stacks of circuits are connected, back-end fabrication techniques of metal routing become challenging and costly. This is especially demanding when there are multiple semiconductor devices among multiple circuits to be interconnected.

SUMMARY

In one aspect, a semiconductor device includes a substrate, a first trench isolation in the substrate, a second trench isolation in the substrate and surrounding a portion of the substrate, and a first routing electrode layer extending through the first trench isolation. The portion of the substrate is an active region of a transistor.

In another aspect, a system includes a memory device and a memory controller. The memory device includes a first peripheral circuit, an array of memory strings, and a bonding layer. The first peripheral circuit includes a first transistor. The first transistor includes a substrate, a first trench isolation in the substrate, a second trench isolation in the substrate and surrounding a portion of the substrate, a routing electrode layer extending through the first trench isolation, and an interconnect layer coupled to the routing electrode layer. The portion of the substrate is an active region of the first transistor. The array of memory strings is coupled to the first peripheral circuit through the bonding layer and the interconnect layer. The memory controller is coupled to the memory device and configured to control the array of memory strings through the first peripheral circuit.

In still another aspect, a method for forming a semiconductor device includes forming a first trench isolation in a substrate in a first region and a second trench isolation in the substrate surrounding a portion of the substrate in a second region, etching back the first trench isolation to form a recess in the first trench isolation, forming a gate dielectric on part of the portion of the substrate, forming a sacrificial electrode layer on the gate dielectric, the portion of the substrate, the first trench isolation, the second trench isolation, and the recess; and patterning the sacrificial electrode layer to form a gate electrode on the gate dielectric and the second trench isolation to form a gate structure, and a first routing electrode layer in the recess.

In yet another aspect, a method for forming a semiconductor device includes forming a first trench isolation in a substrate in a first region and a second trench isolation in the substrate surrounding a portion of the substrate in a second region, etching back the first trench isolation to form a first recess in the first trench isolation and etching back the second trench isolation to form a second recess in the second trench isolation, depositing an isolation material to partially fill the second recess to expose at least part of the portion of the substrate to form a three-dimensional (3D) semiconductor body, forming a gate dielectric on sides of a portion of the 3D semiconductor body, forming a sacrificial electrode layer on the gate dielectric, the 3D semiconductor body, the first trench isolation, the second trench isolation, and the first recess, and patterning the sacrificial electrode layer to form a gate electrode on the gate dielectric and the second trench isolation to form a gate structure, and a first routing electrode layer in the first recess.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

FIGS. 3A-3D illustrate a fabrication process for forming a semiconductor device, according to some aspects of the present disclosure.

FIG. 8 illustrates a block diagram of an exemplary system having a semiconductor device, according to some aspects of the present disclosure.

FIG. 9A illustrates a diagram of an exemplary memory card having a semiconductor device, according to some aspects of the present disclosure.

FIG. 9B illustrates a diagram of an exemplary solid-state drive (SSD) having a semiconductor device, according to some aspects of the present disclosure.

Figure 1A:
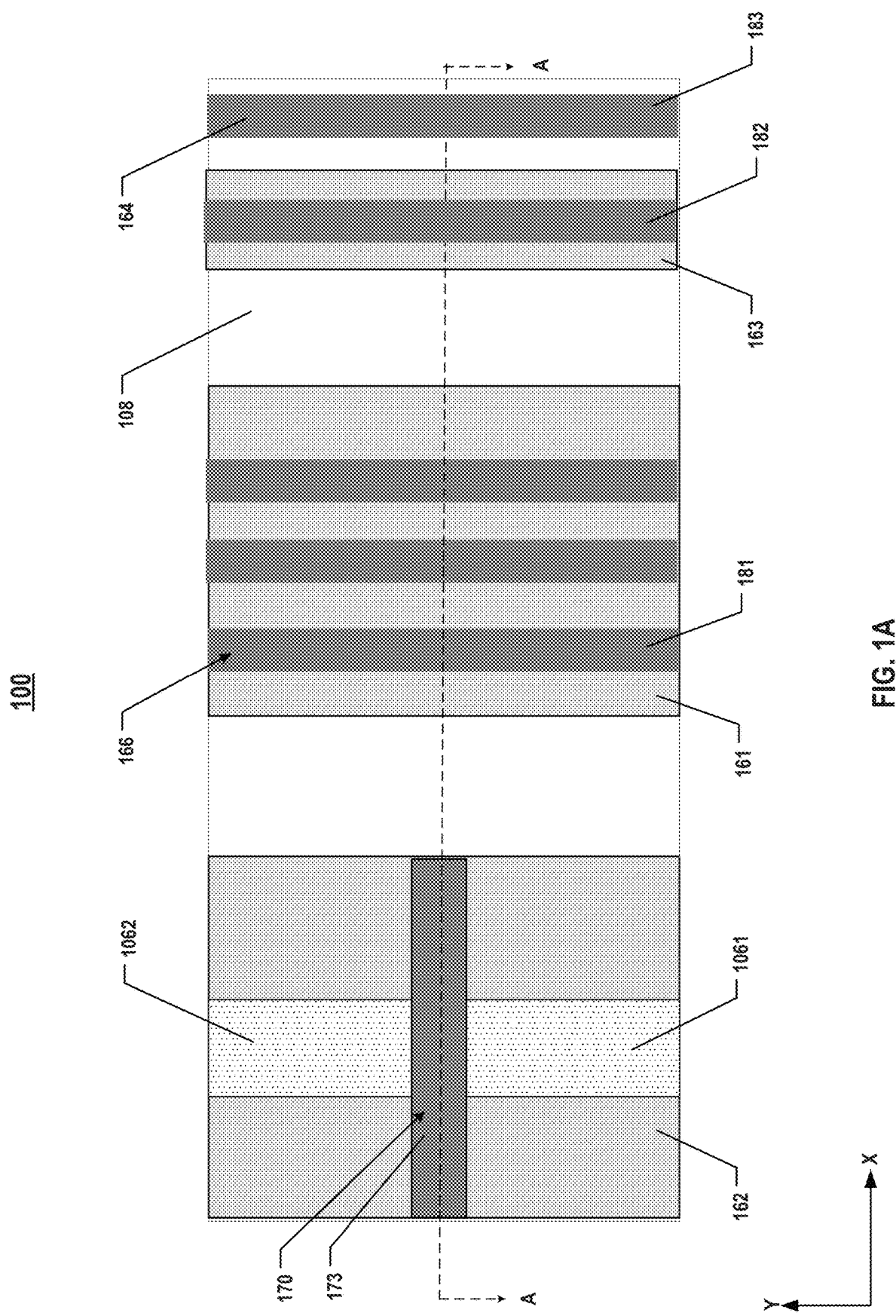
FIG. 1A illustrates a plan view of a semiconductor device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors (in which interconnect lines and/or vertical interconnect access (via) contacts are formed) and one or more dielectric layers.

More stacked arrays require more peripheral circuits for operating multiple semiconductor devices (e.g., memory devices), thereby demanding more area of metal routing on the chip/substrate level to interconnect devices among peripheral circuits and semiconductor devices. For example, to interconnect different semiconductor devices, multiple metal routing paths are needed and should be reserved for further circuit design. One of the methods of metal routing is to use multiple interconnection layers to divide, hierarchize, and thus create additional metal routing paths. However, this increases the cost and complexity of the back-end process when more arrays are stacked. To solve this problem, or at least reduce the burden of the back-end process, a reserved metal routing area at chip/substrate level may be needed. Nevertheless, due to the limited chip area, it is a huge challenge to create extra areas for interconnection at the chip level. In some implementations, one way to create additional areas for metal routing at chip-level is to form a routing electrode layer on a top surface of a trench isolation which is originally used to isolate and separate different devices in the same substrate. That is, the non-active area of the trench isolation can be used to create additional areas for metal routing. However, since the trench isolations are mostly surrounding an active area of the device, the additional metal routing path on the trench isolations cannot be located too close to the active area of the device to prevent undesirable interferences of the device. For instance, these nearby parallel routing electrode layers may increase parasitic capacitances of the devices if arranging too closely. Also, these nearby routing metals may provide additional leakage paths. Either way reduces the performance of the device. In some implementations, another way to create additional areas for metal routing at the chip-level is to expose some non-active areas of the substrate. Since substrates are mostly silicon-based, a routing electrode layer can be placed on the non-active area of the exposed substrate for additional chip-level metal routing. However, though the exposed area of the substrate might be a non-active area, it still has the same voltage level as the bulk of the active device, thereby limiting the use of such a metal routing path.

To address one or more of the aforementioned issues, the present disclosure introduces a solution in which a routing electrode layer is deposited in a recess of the trench isolation such that the routing electrode layer can be used for chip-level metal routing. In some implementations, the disclosed methods of fabricating semiconductor devices including the routing electrode layer can be used in a semiconductor device with a planar transistor, a 3D transistor, or a combination thereof.

Furthermore, some of the processes of forming the transistor and the routing electrode layer can be done in a single process, thereby significantly simplified the fabrication process and reduced the cost.

The disclosed method can also be implemented without in conflict with other methods disclosed in the present application, such as forming the routing electrode layer on the top surface of the trench isolation or forming the routing electrode layer on the non-active area of the exposed substrate. As such, the present disclosure creates more flexibility in terms of processes reduction, more options, and compatibility for metal routing design.

It is noted that the present disclosure uses a semiconductor device with a planar transistor and a semiconductor device with a 3D transistor only for illustrating how to form the routing electrode layers among transistors. Any semiconductor devices having other types of planar transistors or 3D transistors can also be implemented using the disclosed method with suitable modification.

Figure 1B:
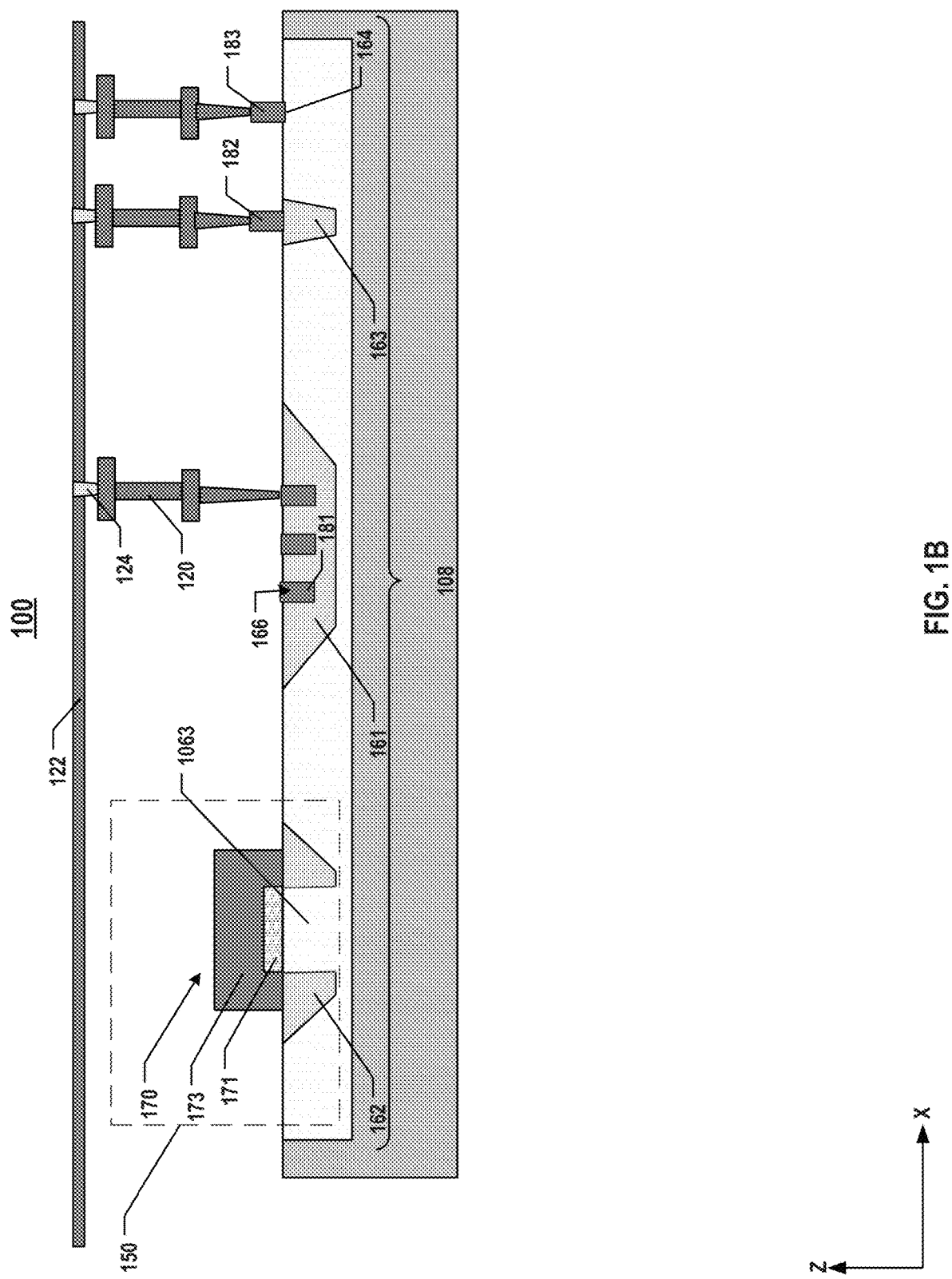
FIG. 1B illustrates a side view of a cross-section of the semiconductor device in FIG. 1A, according to some aspects of the present disclosure.
Figure 1C:
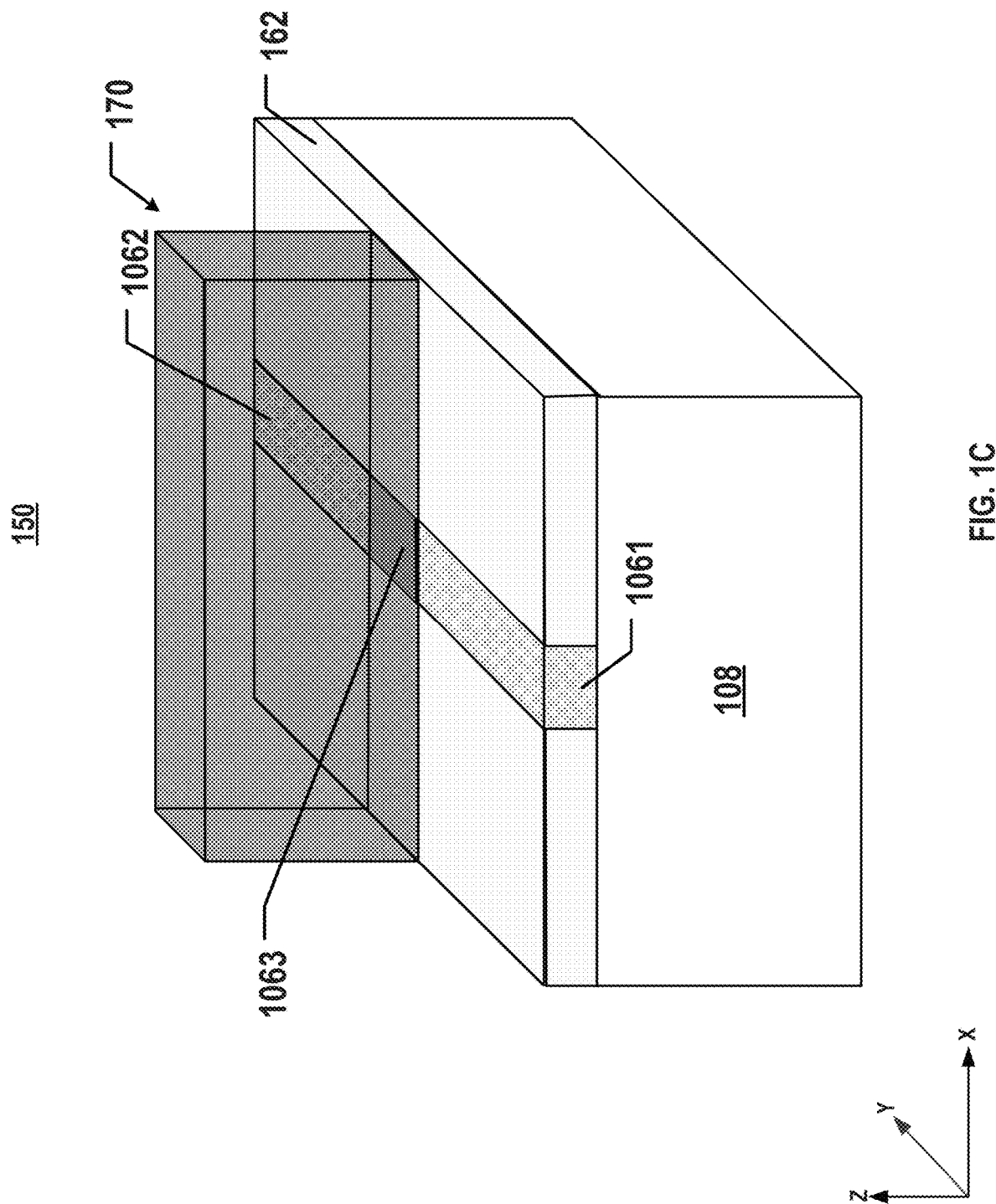
FIG. 1C illustrates a perspective view of a planar transistor of the semiconductor device in FIG. 1B, according to some aspects of the present disclosure.

FIG. 1A illustrates a plan view of a semiconductor device 100 according to some aspects of the present disclosure. FIG. 1B illustrates a side view of a cross-section of semiconductor device 100 in FIG. 1A, according to some aspects of the present disclosure. And FIG. 1C illustrates a perspective view of a planar transistor 150 of semiconductor device 100 in FIG. 1B, according to some aspects of the present disclosure. These three figures will be discussed together. It is noted that FIG. 1A is a plan view in x-y plane and FIG. 1B is a side view in x-z plane. FIG. 1B is the cross-section of semiconductor device 100 in FIG. 1A in the AA plane. As shown in FIG. 1A. semiconductor device 100 includes a substrate 108. Semiconductor device 100 may further include a first trench isolation 161, a second trench isolation 162, and a third trench isolation 163 formed in substrate 108. As shown in FIG. 1B, first trench isolation 161, second trench isolation 162, and third trench isolation 163 extend through substrate 108 in the z-direction. A first routing electrode layer 181 is formed in a recess 166 of first trench isolation 161 and extends through first trench isolation 161 in the z-direction. Second trench isolation 162 surrounds a portion of substrate 108. The portion of substrate 108 can be an active region 1063 of planar transistor 150, as shown in FIG. 1B. Planar transistor 150 may include source 1061, drain 1062, and active region 1063 formed between source 1061 and drain 1062. Planar transistor 150 further includes gate structure 170 in contact with the portion of substrate 108 (e.g., active region 1063 in FIG. 1B). Gate structure 170 may include gate dielectric 171 and gate electrode 173 formed on gate dielectric 171. The portion of substrate 108 is surrounded by source 1061 and drain 1062 in the y-direction and surrounded by second trench isolation 162 in the x-direction.

As mentioned above, a second routing electrode layer 182 can be formed on top surface of third trench isolation 163 for chip-level metal routing, as shown in FIG. 1B. a third routing electrode layer 183 can also be formed on top surface of a non-active region 164 of substrate 108 for chip-level metal routing. These two routing electrode layers 182 or 183 can be combined with routing electrode layer 181 for providing additional chip-level metal routing. An interconnect layer 120 may be formed on routing electrode layers 181, 182, or 183. A bonding contact 124 may be formed on interconnect layer 120. And a bonding layer 122 can be formed on bonding contact 124. That is, routing electrode layers 181, 182, or 183 can be coupled to interconnect layer 120, according to some implementations. And bonding contact 124 and bonding layer 122 can be used to bond one semiconductor device to another peripheral circuits or any other semiconductor devices (e.g., transistors or memory devices).

Substrate 108 can include silicon (e.g., single crystalline silicon, c-Si), silicon germanium (SiGe), gallium arsenide (GaAs), germanium (Ge), silicon on insulator (SOI), or any other suitable materials. It is noted that x-, y-, and z-axes are added in FIGS. 1A, 1B, and 1C to further illustrate the spatial relationships of the components of semiconductor device 100 and planar transistor 150 therein. Substrate 108 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device is determined relative to the substrate of the semiconductor device in the z-direction (the vertical direction or thickness direction) when the substrate is positioned in the lowest plane of the semiconductor device in the z-direction. The same notion for describing the spatial relationship is applied throughout the present disclosure.

Routing electrode layers 181, 182, and 183 include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, routing electrode layers 181, 182, and 183 includes doped polysilicon, i.e., a gate poly. In some implementations, a material of routing electrode layers 181, 182, and 183 may be the same as that of gate electrode layer 173 such that they can be formed in the same deposition process.

Trench isolations 161, 162 or 163, such as shallow trench isolations (STI), can be formed in or on substrate 108 and between adjacent transistors to reduce current leakage. Trench isolations 161, 162 or 163 can include any suitable dielectric materials, such as silicon oxide, silicon nitride, silicon oxynitride, or high-k dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, a material of trench isolations 161, 162, and 163 includes silicon oxide.

As shown in FIG. 1C, a planar transistor 150 can be a metal-oxide-semiconductor field-effect-transistor (MOSFET) on a substrate 108, which can include silicon (e.g., single crystalline silicon, c-Si), silicon germanium (SiGe), gallium arsenide (GaAs), germanium (Ge), silicon on insulator (SOI), or any other suitable materials. As shown in FIG. 1C, planar transistor 150 can also include a gate structure 170 on substrate 108. In some implementations, gate structure 170 is on the top surface of substrate 108. As shown in FIG. 1B, gate structure 170 can include a gate dielectric 171 on substrate 108, i.e., above and in contact with the top surface of substrate 108. Gate structure 170 can also include a gate electrode layer 173 on gate dielectric 171, i.e., above and in contact with gate dielectric 171. Gate dielectric 171 can include any suitable dielectric materials, such as silicon oxide, silicon nitride, silicon oxynitride, or high-k dielectrics. In some implementations, gate dielectric 171 includes silicon oxide, i.e., a gate oxide. Gate electrode layer 173 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, gate electrode layer 173 includes doped polysilicon, i.e., a gate poly.

As shown in FIG. 1C, planar transistor 150 can further include a pair of source 1061 and drain 1062 in substrate 108. Source 1061 and drain 1062 can be doped with any suitable P-type dopants, such as boron (B) or Gallium (Ga), or any suitable N-type dopants, such as phosphorus (P) or arsenic (Ar). Source 1061 and drain 1062 can be separated by gate structure 170 in the plan view. In other words, gate structure 170 is formed between source 1061 and drain 1062 in the plan view, according to some implementations. The channel of planar transistor 150 in substrate 108 can be formed laterally between source 1061 and drain 1062 under gate structure 170 when a gate voltage applied to the gate electrode layer 173 of gate structure 170 is above the threshold voltage of planar transistor 150. As shown in FIG. 1C, gate structure 170 can be above and in contact with the top surface of the part of substrate 108 in which the channel can be formed (e.g., active region 1063). That is, gate structure 170 is in contact with only one side of active region 1063, i.e., in the plane of the top surface of substrate 108, according to some implementations. And the part of substrate 108 is in contact with and surrounded by second trench isolation 162 on two sides in the x-direction, and source 1061 and drain 1062 on another two sides in the y-direction. It is understood, although not shown in FIG. 1C, planar transistor 150 may include additional components, such as wells and spacers.

Figure 2A:
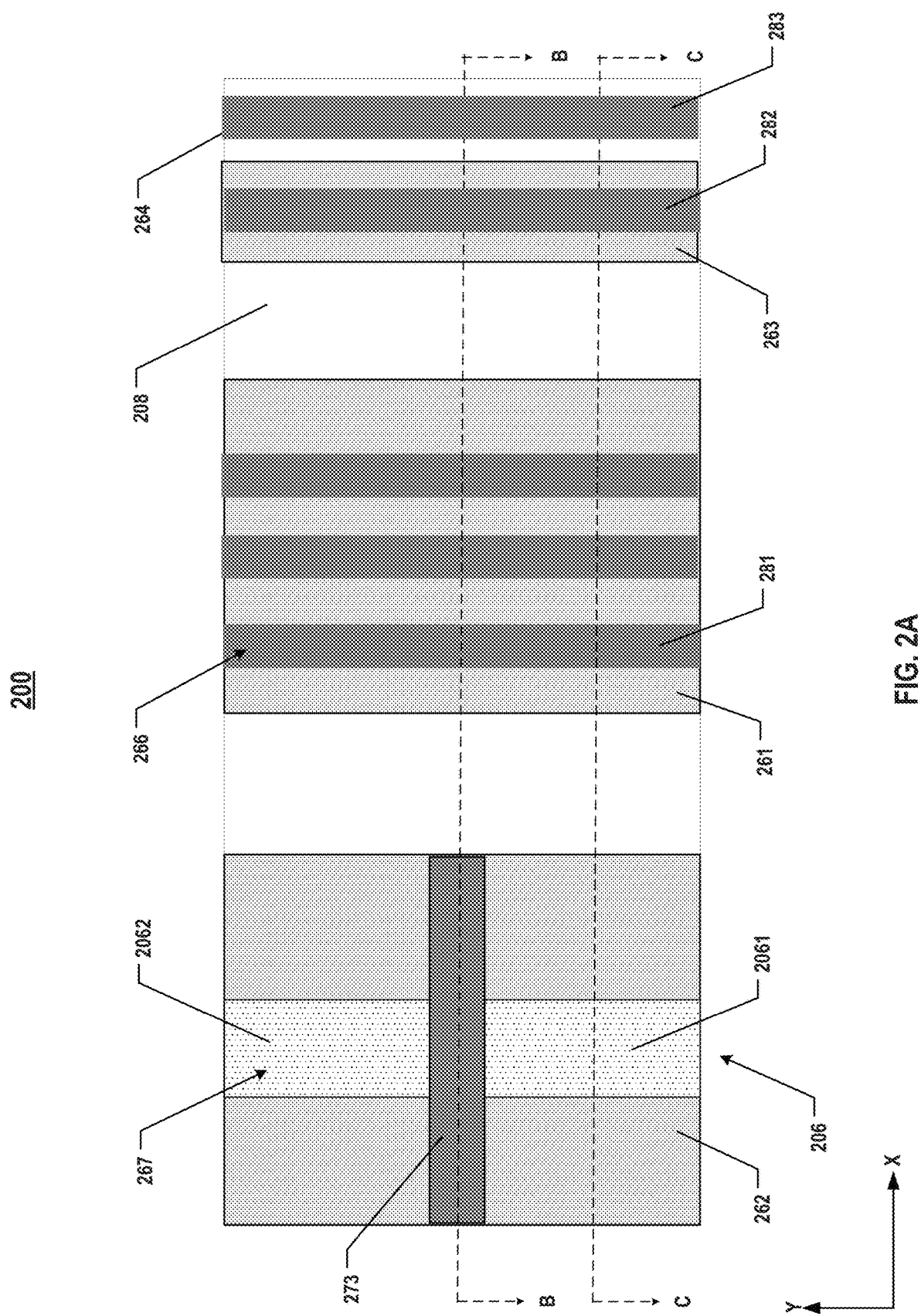
FIG. 2A illustrates a plan view of another semiconductor device, according to some aspects of the present disclosure.
Figure 2B:
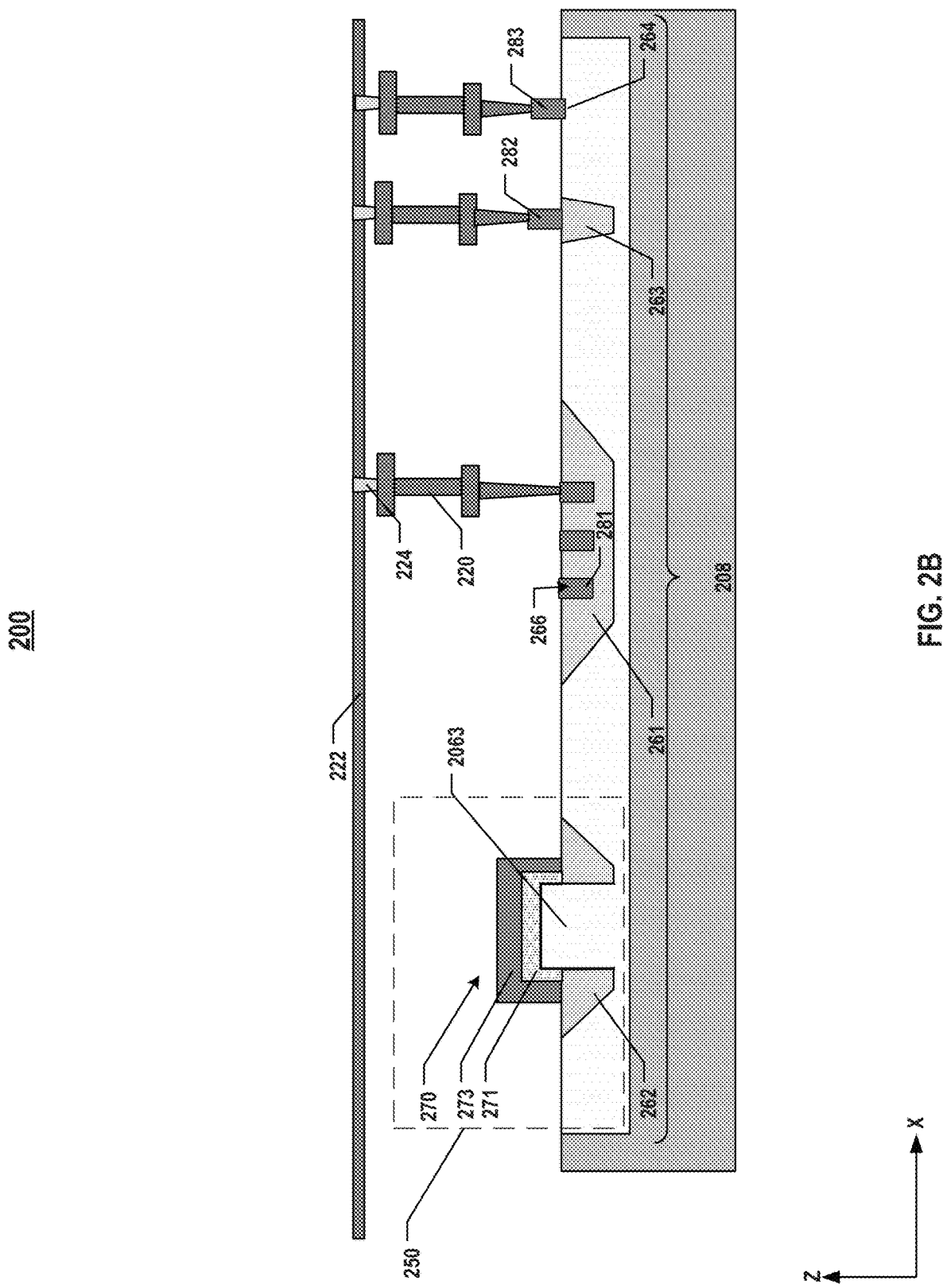
FIG. 2B illustrates a side view of a cross-section of another semiconductor device in FIG. 2A, according to some aspects of the present disclosure.
Figure 2C:
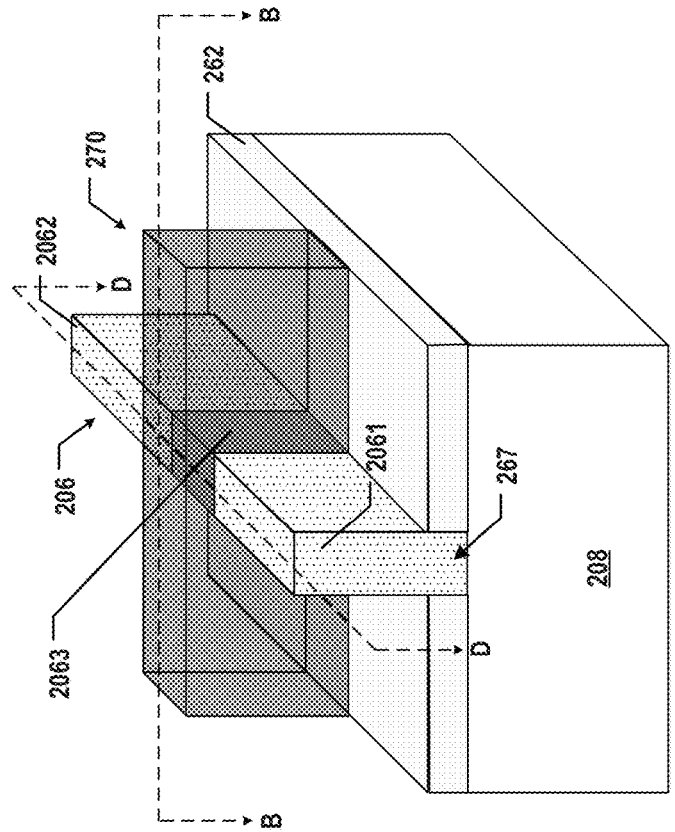
FIG. 2C illustrates a perspective view of a 3D transistor of the semiconductor device in FIG. 2B, according to some aspects of the present disclosure.
Figure 2D:
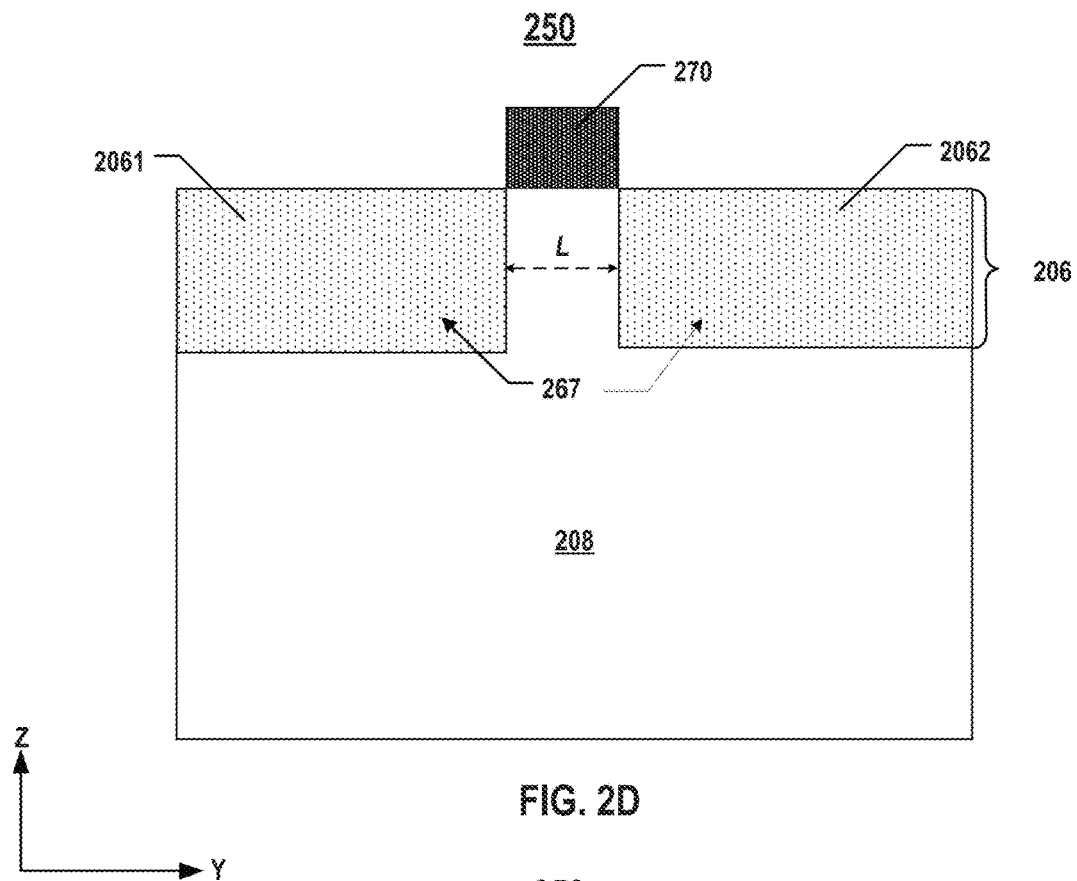
FIGS. 2D and 2E illustrate side views of two cross-sections of the 3D transistor in FIG. 2C, according to some aspects of the present disclosure.
Figure 2E:
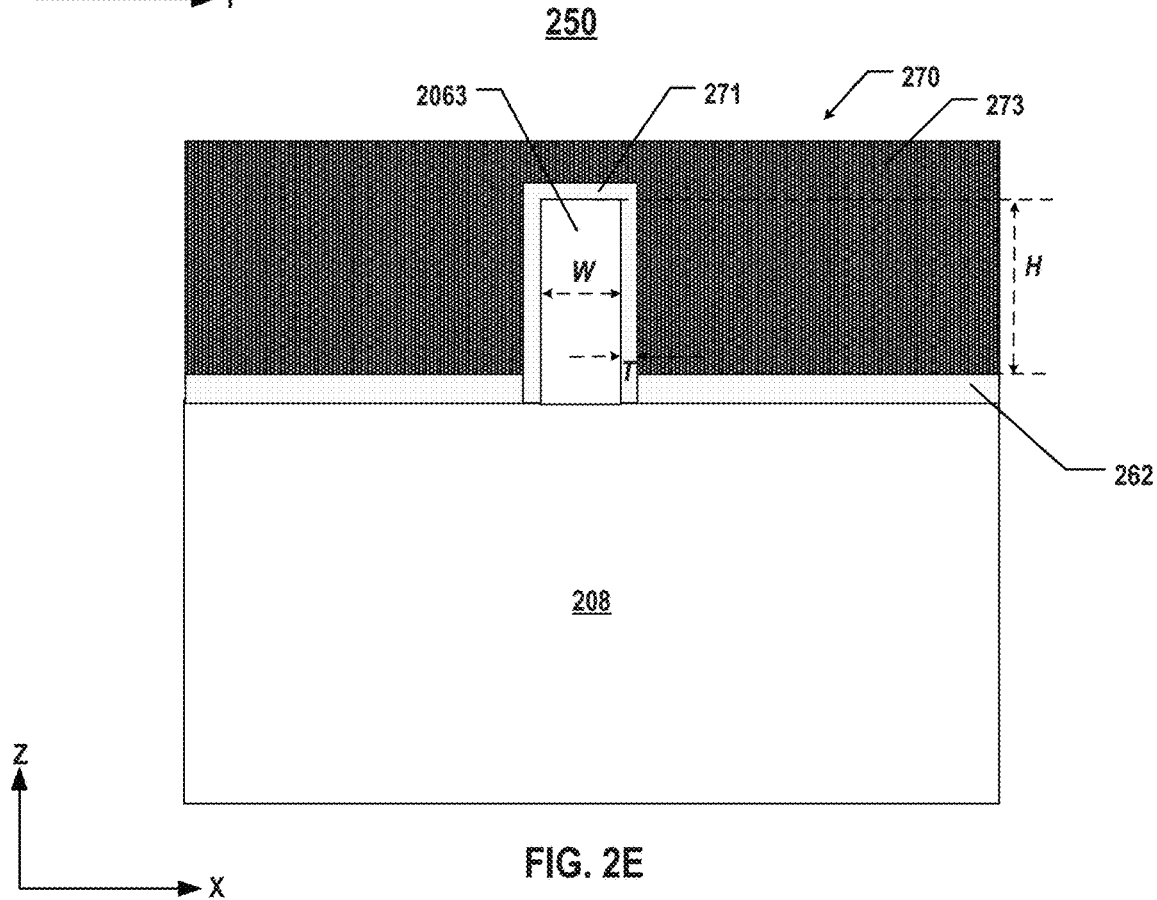

FIG. 2A illustrates a plan view of a semiconductor device 200 according to some aspects of the present disclosure. FIG. 2B illustrates a side view of a cross-section of semiconductor device 200 in FIG. 2A, according to some aspects of the present disclosure. And FIG. 2C illustrates a perspective view of a 3D transistor 250 of semiconductor device 200 in FIG. 2B, according to some aspects of the present disclosure. FIGS. 2D and 2E illustrate side views of two cross-sections of the 3D transistor in FIG. 2C, according to some aspects of the present disclosure. These five figures will be discussed together. It is noted that FIG. 2A is a plan view in the x-y plane and FIG. 2B is a side view in the x-z plane. FIG. 2B is the cross-section of semiconductor device 200 in FIG. 2A in the BB plane. As shown in FIG. 2A, a semiconductor device 200 includes a substrate 208. Semiconductor device 200 may further include a first trench isolation 261, a second trench isolation 262, and a third trench isolation 263 formed in substrate 208. As shown in FIG. 2B, first trench isolation 261, second trench isolation 262, and third trench isolation 263 extend through substrate 208 in the z-direction. A first routing electrode layer 281 is formed in a first recess 266 of first trench isolation 261 and extends through first trench isolation 261 in the z-direction. Second trench isolation 262 surrounds a portion of substrate 208. The portion of substrate 208 can be an active region 2063 of 3D transistor 250, as shown in FIG. 2B. As shown in FIGS. 2A and 2C, 3D transistor 250 may include a 3D semiconductor body 206 having a source 2061, a drain 2062, and the active region 2063 (e.g., in FIG. 2B) formed between source 2061 and drain 2062. 3D semiconductor body 206 is formed in a second recess 267 extending through second trench isolation 262 in the z-direction. That is, at least a portion of 3D semiconductor body 206 is surrounded by second trench isolation 262. 3D transistor 250 further includes gate structure 270 in contact with the portion of substrate 208 (e.g., active region 2063 in FIG. 2B). Gate structure 270 may include a gate dielectric 271 and a gate electrode layer 273 formed on gate dielectric 271. The portion of substrate 208 is surrounded by source 2061 and drain 2062 in the y-direction and surrounded by second trench isolation 262 in the x-direction.

As mentioned above, a second routing electrode layer 282 can be formed on the top surface of third trench isolation 263 for chip-level metal routing, as shown in FIG. 2B. A third routing electrode layer 283 can also be formed on the top surface of a non-active region 264 of substrate 208 for chip-level metal routing. These two routing electrode layers 282 or 283 can be combined with routing electrode layer 281 in order to provide additional chip-level metal routing. An interconnect layer 220 may be formed on routing electrode layers 281, 282, or 283. A bonding contact 224 may be formed on interconnect layer 220. And a bonding layer 222 can be formed on bonding contact 224. That is, routing electrode layers 281, 282, or 283 can be coupled to interconnect layer 220 to interconnect semiconductor devices. And bonding contact 224 and bonding layer 222 can be used to bond one semiconductor device to another peripheral circuits or any other semiconductor devices (e.g., transistors or memory devices). Therefore, different semiconductor devices can be interconnected through the routing electrode layers, interconnect layers, bonding layers, and bonding contacts.

Substrate 208 can include silicon (e.g., single crystalline silicon, c-Si), silicon germanium (SiGe), gallium arsenide (GaAs), germanium (Ge), silicon on insulator (SOI), or any other suitable materials.

Routing electrode layers 281, 282, and 283 include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, routing electrode layers 281, 282, and 283 includes doped polysilicon, i.e., a gate poly. In some implementations, a material of routing electrode layers 281, 282, and 283 may be the same as that of gate electrode layer 273 such that they can be formed in the same deposition process.

Trench isolations 261, 262, or 263, such as shallow trench isolations (STI), can be formed in or on substrate 208 and between adjacent transistors to reduce current leakage. Trench isolations 261, 262, or 263 can include any suitable dielectric materials, such as silicon oxide, silicon nitride, silicon oxynitride, or high-k dielectrics (e.g., aluminum oxide, hafnium oxide, zirconium oxide, etc.). In some implementations, high-k dielectric materials include any dielectrics having a dielectric constant, or k-value, higher than that of silicon nitride (k>7). In some implementations, a material of trench isolations 261, 262, or 263 includes silicon oxide.

As shown in FIG. 2C, a 3D transistor 250 can be a MOS field-effect-transistor (MOSFET) on a substrate 208, which can include silicon (e.g., single crystalline silicon, c-Si), silicon germanium (SiGe), gallium arsenide (GaAs), germanium (Ge), silicon on insulator (SOI), or any other suitable materials. As shown in FIG. 2C, 3D transistor 250 can also include a gate structure 270 on substrate 208. In some implementations, gate structure 270 is on a portion of substrate 208. As shown in FIG. 2B, gate structure 270 can include a gate dielectric 271 on substrate 208, i.e., above and in contact with a portion of substrate 208. Gate structure 270 can also include a gate electrode layer 273 on gate dielectric 271, i.e., above and in contact with gate dielectric 271. Gate dielectric 271 can include any suitable dielectric materials, such as silicon oxide, silicon nitride, silicon oxynitride, or high-k dielectrics. In some implementations, gate dielectric 271 includes silicon oxide, i.e., a gate oxide. Gate electrode layer 273 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, gate electrode layer 273 includes doped polysilicon, i.e., a gate poly.

As shown in FIG. 2C, 3D transistor 250 can further include a 3D semiconductor body 206 having a pair of source 2061 and drain 2062, and the active region 2063 (e.g., in FIG. 2B) in substrate 208. 3D semiconductor body 206 at least partially extends above the top surface of substrate 208 to expose not only the top surface, but also the two side surfaces, of 3D semiconductor body 206. As shown in FIG. 2C, for example, 3D semiconductor body 206 may be in a 3D structure, which is also known as a "fin," to expose three sides thereof. Also, 3D semiconductor body 206 may extend through second trench isolation 262 and may be at least partially surrounded by second trench isolation 262 on two sides in the x-direction. In some implementations, 3D semiconductor body 206 is formed from substrate 208 and thus, has the same semiconductor material as substrate 208. In some implementations, 3D semiconductor body 206 includes single crystalline silicon. Source 2061 and drain 2062 can be doped with any suitable P-type dopants, such as boron (B) or Gallium (Ga), or any suitable N-type dopants, such as phosphorus (P) or arsenic (Ar). Source 2061 and drain 2062 can be separated by gate structure 270 in the plan view. In other words, gate structure 270 is formed between source 2061 and drain 2062 in the plan view, according to some implementations. The channel of 3D transistor 250 in substrate 208 can be formed laterally between source 2061 and drain 2062 under gate structure 270 when a gate voltage applied to the gate electrode layer 273 of gate structure 270 is above the threshold voltage of 3D transistor 250. As shown in FIG. 2C, gate structure 270 can be above and in contact with the portion substrate 208 in which the channel can be formed (active region 2063 in FIG. 2B). That is, gate structure 270 is in contact with three sides of active region 2063, i.e., in the top plane of the portion of substrate 208, and two lateral planes of the portion of substrate 208, according to some implementations. And the portion of substrate 208 is surrounded by gate structure 270 in the x-direction, and source 2061 and drain 2062 on another two sides in the y-direction. It is understood although not shown in FIG. 2C, 3D transistor 250 may include additional components, such as wells and spacers.

FIG. 2D illustrates a side view of the cross-section of 3D transistor 250 in FIG. 2C in the DD plane, according to some aspects of the present disclosure. FIG. 2E illustrates a side view of the cross-section of 3D transistor 250 in FIG. 2C in the BB plane, according to some aspects of the present disclosure. As shown in FIGS. 2D and 2E, 3D transistor 250 can also include gate structure 270 on substrate 208. Different from planar transistors 150 in which gate structure 170 is in contact with only one side of active region 1063, i.e., in the plane of the top surface of substrate 108, gate structure 270 of 3D transistor 250 can be in contact with a plurality of sides of the active region 2063, i.e., in multiple planes of the top surface and side surfaces of 3D semiconductor body 206. In other words, active region 2063 of 3D transistor 250, i.e., 3D semiconductor body 206, can be at least partially surrounded by gate structure 270.

Gate structure 270 can include gate dielectric 271 over 3D semiconductor body 206, e.g., in contact with the top surface and two side surfaces of 3D semiconductor body 206. Gate structure 270 can also include gate electrode layer 273 over and in contact with gate dielectric 271. Gate dielectric 271 can include any suitable dielectric materials, such as silicon oxide, silicon nitride, silicon oxynitride, or high-k dielectrics. In some implementations, gate dielectric 271 includes silicon oxide, i.e., a gate oxide. Gate electrode layer 273 can include any suitable conductive materials, such as polysilicon, metals (e.g., W, Cu, Al, etc.), metal compounds (e.g., TiN, TaN, etc.), or silicides. In some implementations, gate electrode layer 273 includes doped polysilicon, i.e., a gate poly.

As shown in FIGS. 2D and 2E, 3D transistor 250 can further include pair of source 2061 and drain 2062 in substrate 208. Source 2061 and drain 2062 can be doped with any suitable P-type dopants, such as B or Ga, or any suitable N-type dopants, such as P or Ar. After doping to form source 2061 and drain 2062, an active region 2063 of the 3D semiconductor body 206, which can also be part of substrate 208 extending in z-direction, is formed between source 2061 and drain 2062 on two lateral sides in the y-direction and surrounded by gate structure 270 on another two lateral sides in the x-direction and one top side in the z-direction. Source 2061 and drain 2062 can be separated by gate structure 270 in the plan view. In other words, gate structure 270 is formed between source 2061 and drain 2062 in the plan view, according to some implementations. As a result, multiple channels of 3D transistor 250 in 3D semiconductor body 206 can be formed laterally between source 2061 and drain 2062 surrounded by gate structure 270 when a gate voltage applied to gate electrode layer 273 of gate structure 270 is above the threshold voltage of 3D transistor 250. Different from planar transistor 150 in which only a single channel can be formed on the top surface of substrate 208, multiple channels can be formed on the top surface and side surfaces of 3D semiconductor body 206 in 3D transistor 250. In some implementations, 3D transistor 250 includes a multi-gate transistor. That is, different from planar transistor 150 that includes only a single gate, 3D transistors 250 can include a plurality of gates on a plurality of sides of 3D semiconductor body 206 due to the 3D structure of 3D semiconductor body 206 and gate structure 270 that surrounds the plurality of sides of 3D semiconductor body 206. As a result, compared with planar transistor 150, 3D transistor 250 can have a larger gate control area to achieve better channel control with a smaller subthreshold swing. During the off state, since the channel is fully depleted, the leakage current (100 of 3D transistor 250 can be significantly reduced a well. On the other hand, the dimensions of 3D transistor 250 can be significantly reduced from planar transistor 150 while still maintaining the same electrical performance (e.g., channel control, subthreshold swing, and/or leakage current) as planar transistor 150.

Figure 5:
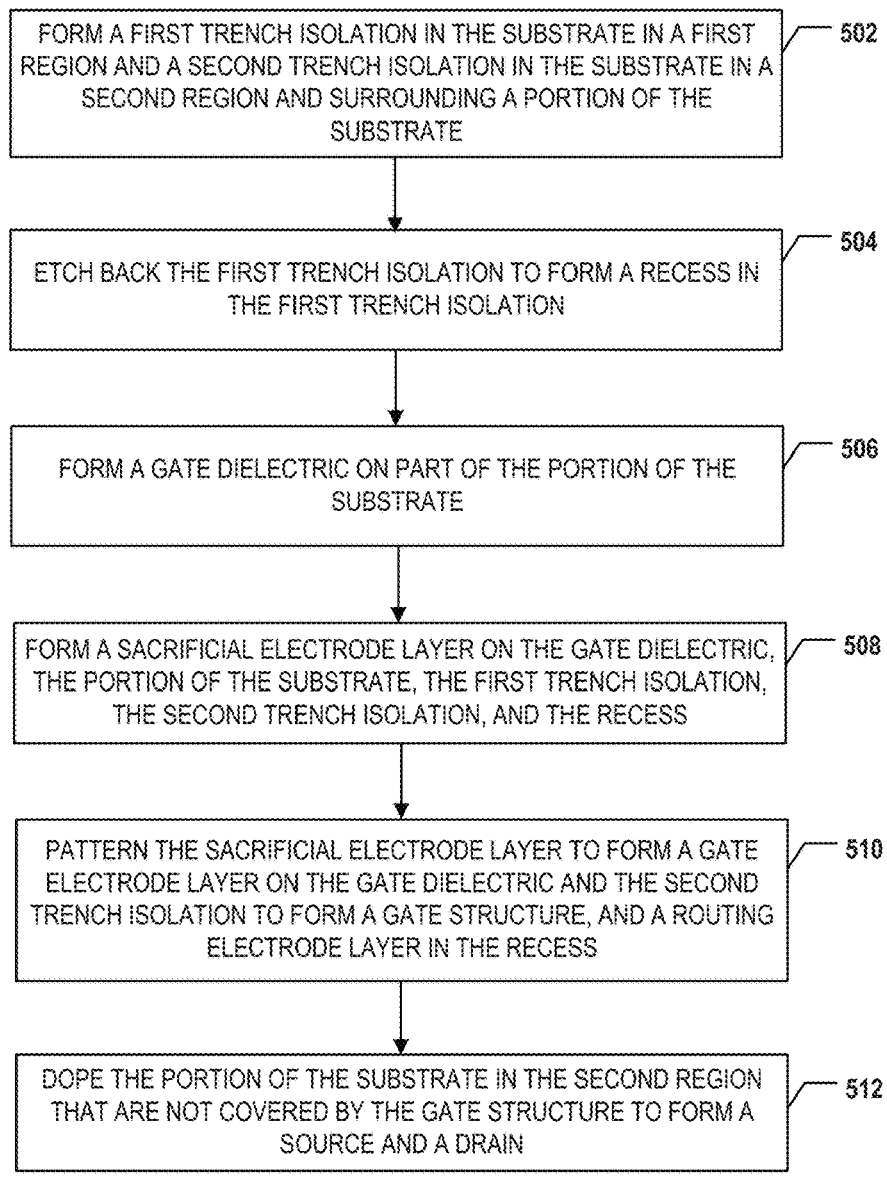
FIG. 5 illustrates a flowchart of a method for forming an exemplary semiconductor device, according to some aspects of the present disclosure.

To form a semiconductor device with trench isolations and routing electrode layers, FIGS. 3A-3D illustrate a fabrication process for forming a planar transistor with a routing electrode layer, according to some aspects of the present disclosure. FIG. 5 illustrates a flowchart of a method 500 for forming an exemplary semiconductor device with a planar transistor with a routing electrode layer, according to some aspects of the present disclosure. Examples of semiconductor devices depicted in FIG. 3A-3D include semiconductor devices 100 depicted in FIGS. 1A and 1B. Examples of trench isolations depicted in FIG. 3A-3D include trench isolations 161, 162, and 163 depicted in FIGS. 1A and 1B. Examples of routing electrode layers depicted in FIG. 3A-3D include routing electrode layers 181 depicted in FIGS. 1A and 1B. Examples of planar transistors depicted in FIG. 3A-3D include planar transistors 150 depicted in FIG. 1C. It is understood that the operations shown in method 500 are not exhaustive and that other operations can be performed as well before, after, or between any of the illustrated operations. Further, some of the operations may be performed simultaneously, or in a different order than shown in FIG. 5. FIGS. 3A-3D and 5 will be described together.

Figure 3A:
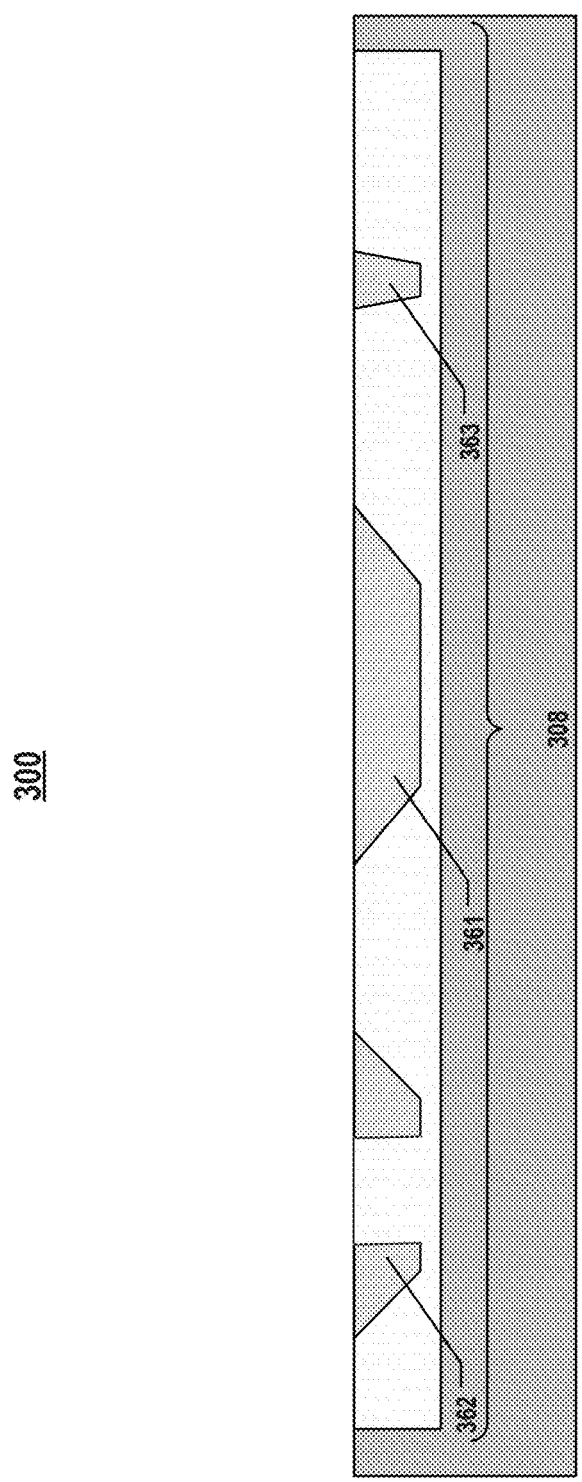

Referring to FIG. 5, method 500 starts at operation 502, in which a first trench isolation in a substrate in a first region, and a second trench isolation is formed in a substrate surrounding a portion of the substrate in a second region. For example, as illustrated in FIG. 3A, trench isolation 361

(corresponding to 161 in FIG. 1A) is formed in substrate 308 (corresponding to 108 in FIG. 1A) in the first region, and trench isolation 362 (corresponding to 162 in FIG. 1A) is formed in substrate 308 surrounding a portion of substrate 308 in the second region. In some implementations, third trench isolation 363 (corresponding to 163 in FIG. 1A) is formed in substrate 308 in a third region in the same process. Examples of trench isolation 362 surrounding the portion of substrate 308 in the second region can also be shown in FIGS. 1B and 1C where second trench isolation 162 surrounds the portion (source 1061 and drain 1062, and active region 1063) of the substrate 108. In some implementations, trench isolation 361, 362, or 363 can be STIs and is formed in a substrate 308, for example, using wet/dry etch and thin film deposition of silicon oxide. The top surface of trench isolation 361, 362, or 363 can be planarized using, for example, chemical mechanical polishing (CMP). Trench isolations 361, 362, or 363 can divide substrate 308 into multiple regions in which multiple transistors can be formed, respectively. In some implementations, the portion of substrate 308 surrounded by trench isolation 362 is an active region (e.g., 1063 in FIG. 1B) of a transistor (e.g., 150 in FIGS. 1B and 1C).

Figure 3B:
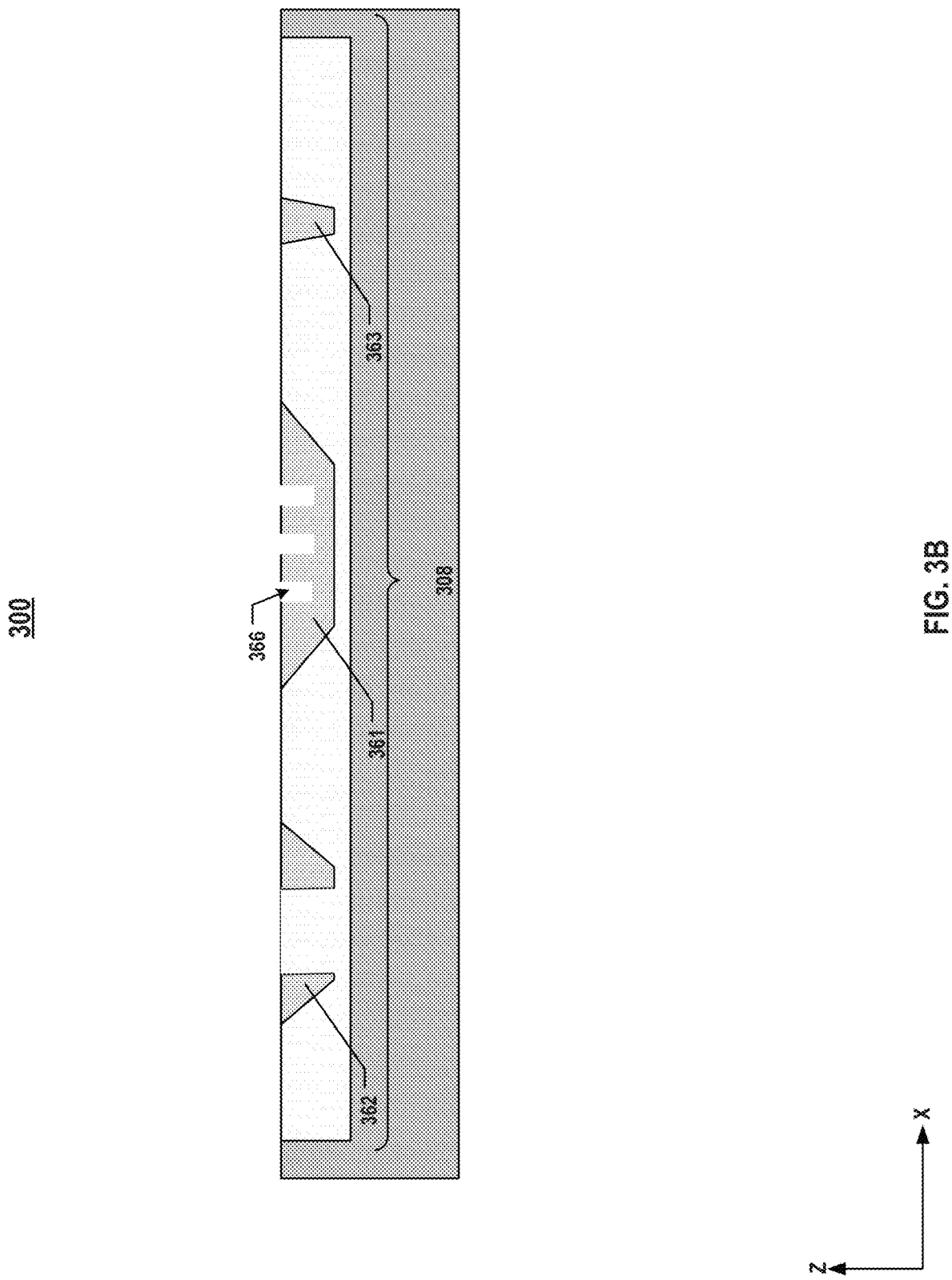

Method 500 proceeds to operation 504, as illustrated in FIG. 5, in which the first trench isolation is etched back to form a recess in the first trench isolation. For example, as illustrated in FIG. 3B, trench isolation 361 is etched back to form recess 366 in trench isolation 361. In some implementations, recess 366 can be more than one, for example, three recesses 366 in trench isolation 361.

Figure 3C:
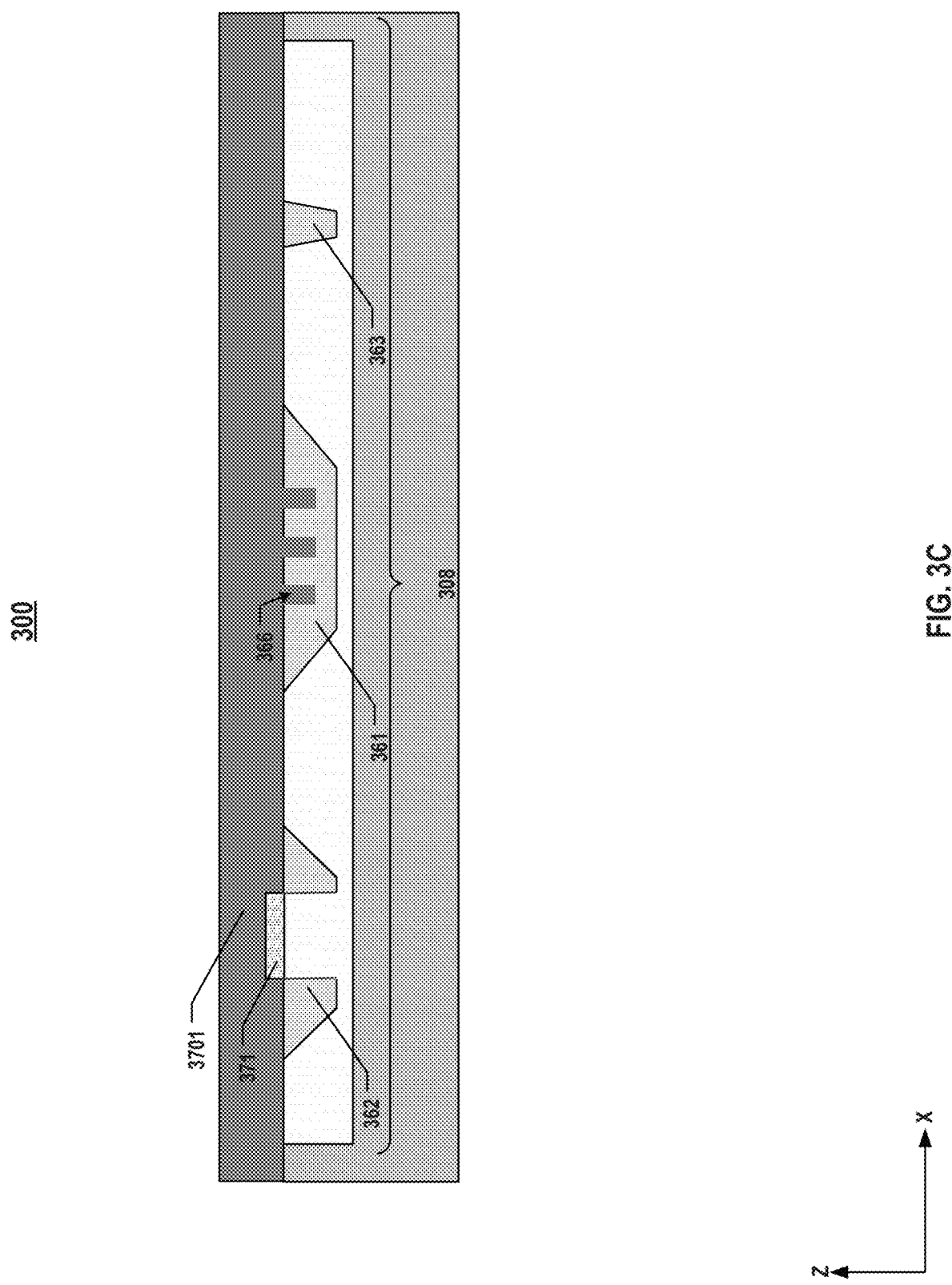

Method 500 proceeds to operation 506, as illustrated in FIG. 5, in which a gate dielectric is formed on a part of the portion of the substrate. For example, as illustrated in FIG. 3C, gate dielectric 371 is formed on a part of the portion of substrate 308. In some implementations, gate dielectric 371 is formed on a top surface of the substrate 308. Examples of gate dielectric 371 can be shown in FIG. 1C, where gate dielectric 171 is formed between gate electrode layer 173 and the top surface of substrate 108 in the z-direction, and between source 1061 and drain 1062 in the y-direction. The gate dielectric can include any suitable dielectric materials, such as silicon oxide, silicon nitride, silicon oxynitride, or high-k dielectrics. In some implementations, the gate dielectric includes silicon oxide, i.e., a gate oxide. The gate electrode layer can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, the gate electrode layer includes doped polysilicon, i.e., a gate poly.

Method 500 proceeds to operation 508, as illustrated in FIG. 5, in which a sacrificial electrode layer is formed on the gate dielectric, the part of the portion of the substrate, the first trench isolation, the second trench isolation, and the recess. For example, as illustrated in FIG. 3C, sacrificial electrode layer 3701 is formed on gate dielectric 371, the part of the portion of substrate 308, trench isolation 361, trench isolation 362, trench isolation 363, and recess 366. In some implementations, a material of the sacrificial electrode layer is deposited using one or more thin film deposition processes including, but not limited to, chemical vapor deposition (CVD), physical vapor deposition (PVD), atomic layer deposition (ALD), or any combination thereof.

Method 500 proceeds to operation 510, as illustrated in FIG. 5, in which the sacrificial electrode layer is patterned to form a gate electrode layer on the gate dielectric and the second trench isolation to form a gate structure, and a routing electrode layer in the recess. For example, as illustrated in FIG. 3D, sacrificial electrode layer 3701 (e.g., in FIG. 3C) is patterned to form gate electrode layer 373 on gate dielectric 371 and trench isolation 362 to form a gate structure 370, and routing electrode layer 381 in recess 366. In some implementations, gate structure 370 is formed on a top surface of trench isolation 362 and the top surface of substrate 308. Examples of gate structure 370 can be shown in FIG. 1C where gate structure 170 is formed on a top surface of second trench isolation 162 and the top surface of substrate 108 in the z-direction and separates source 1061 and drain 1062 in y-direction in the plan view. In some implementations, sacrificial electrode layer 3701 (e.g., in FIG. 3C) can be patterned using lithography and wet/dry etch to form gate electrode layer 373. Also, as illustrated in FIG. 3D, in the same operation, a first routing electrode layer 381 is formed in recess 366 of first trench isolation 361, and a second routing electrode layer 382 is formed on the top surface of third trench isolation 363. In some implementations, sacrificial electrode layer 3701 (e.g., in FIG. 3C) can be patterned using lithography and wet/dry etch to form routing electrode layer 381 in recess 366 and routing electrode layer 382 on the top surface of third trench isolation 363. In some implementations, to form routing electrode layers 381 and 382, and gate electrode layer 373 in the same process, a mask (not shown) can be formed on a top surface of sacrificial electrode layer 3701 to cover a region where the routing electrode layers 381 and 382 and gate electrode layer 373 will be formed, and a wet/dry etch is applied on the mask to pattern sacrificial electrode layer 3701 to expose substrate 308 and trench isolations 361, 362, and 363. The mask is then removed and routing electrode layers 381 and 382, and gate electrode layer 373 are formed. As such, in some implementations, a height of gate electrode layer 373 can be the same or similar as that of routing electrode layer 381 and routing electrode layer 382. In some implementations, routing electrode layer 381 can be planarized by a wet/dry etch to be co-planar with trench isolation 361, and thus routing electrode layer 381 is embedded in recess 366 to avoid interference with other gate structures or routing electrode layers. In some implementations, routing electrode layer 381 or routing electrode layer 382 can be coupled to an interconnect layer (e.g., 120 in FIG. 1B) and thereby providing additional chip-level metal routing paths. In some implementations, routing electrode layer 381 or routing electrode layer 382 can be coupled to a bonding contact (e.g., 124 in FIG. 1B). and a bonding layer (e.g., 122 in FIG. 1B) via the interconnect layer.

Method 500 proceeds to operation 512, as illustrated in FIG. 5, in which the portion of the substrate in the second region that is not covered by the gate structure is doped to form a source and a drain. For example, as illustrated in FIG. 1C, the portion of substrate 108 that is not covered by gate structure 170 is doped to form source 1061 and drain 1062. Source 1061 and drain 1062 can be doped with any suitable P-type dopants, such as boron (B) or Gallium (Ga), or any suitable N-type dopants, such as phosphorus (P) or arsenic (Ar).

Figure 6:
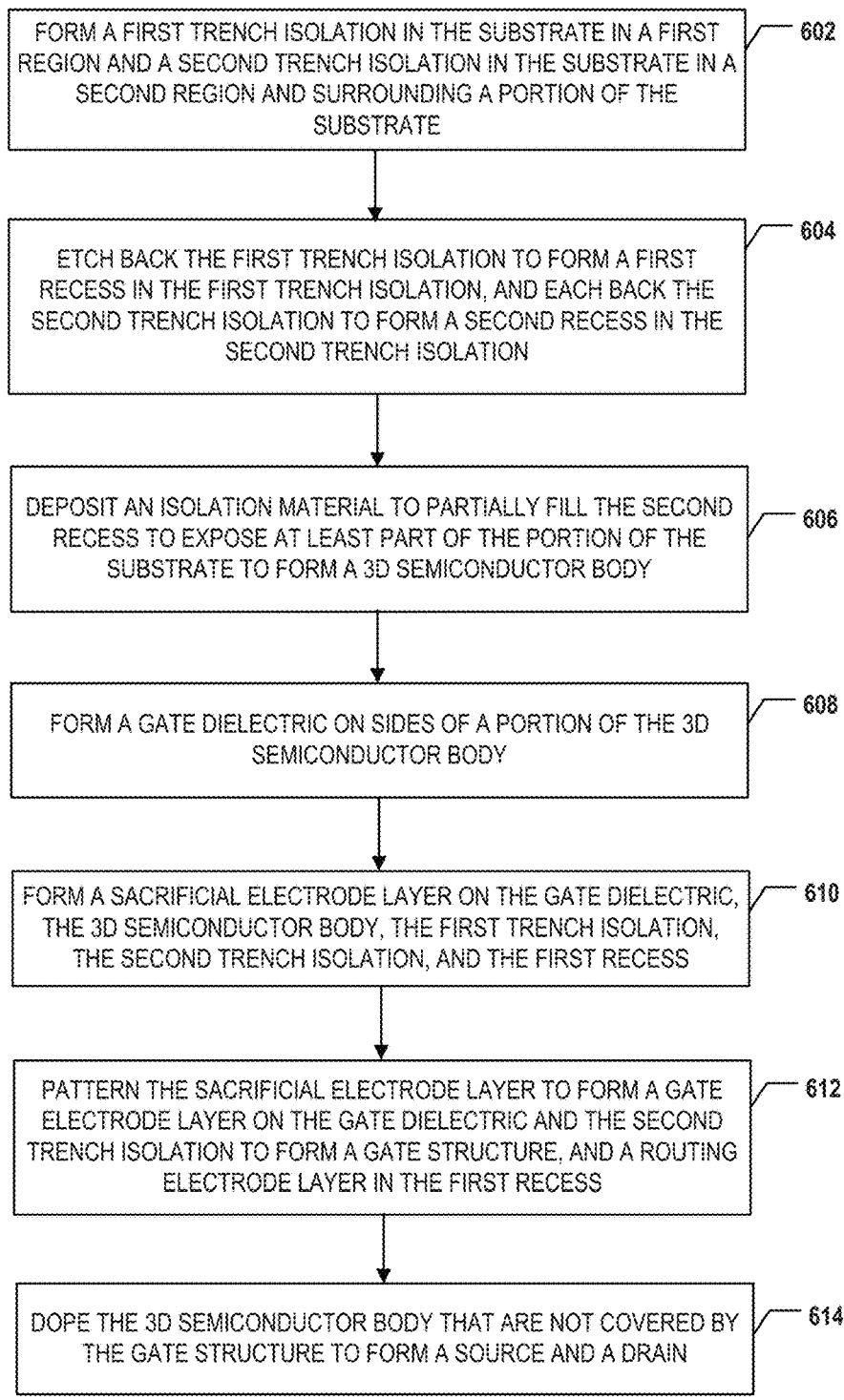
FIG. 6 illustrates a flowchart of a method for forming another exemplary semiconductor device, according to some aspects of the present disclosure.

To form a semiconductor device with trench isolations and routing electrode layers, FIGS. 4A-4E illustrate a fabrication process for forming a 3D transistor with a routing electrode layer, according to some aspects of the present disclosure. FIG. 6 illustrates a flowchart of a method 600 for forming an exemplary semiconductor device with a 3D transistor with a routing electrode layer, according to some aspects of the present disclosure. Examples of semiconductor devices depicted in FIG. 4A-4E include semiconductor devices 200 depicted in FIGS. 2A and 2B. Examples of trench isolations depicted in FIG. 4A-4E include trench isolations 261, 262, and 263 depicted in FIGS. 2A and 2B. Examples of routing electrode layers depicted in FIGS. 4A-4E include routing electrode layers 281 and 282 depicted in FIGS. 2A and 2B. Examples of 3D transistors depicted in FIG. 4A-4E include 3D transistors 250 in FIG. 2C. It is understood that the operations shown in method 600 are not exhaustive and that other operations can be performed as well before, after, or between any of the illustrated operations. Further, some of the operations may be performed simultaneously, or in a different order than shown in FIG. 6. FIGS. 4A-4E and 6 will be described together.

Figure 4A:
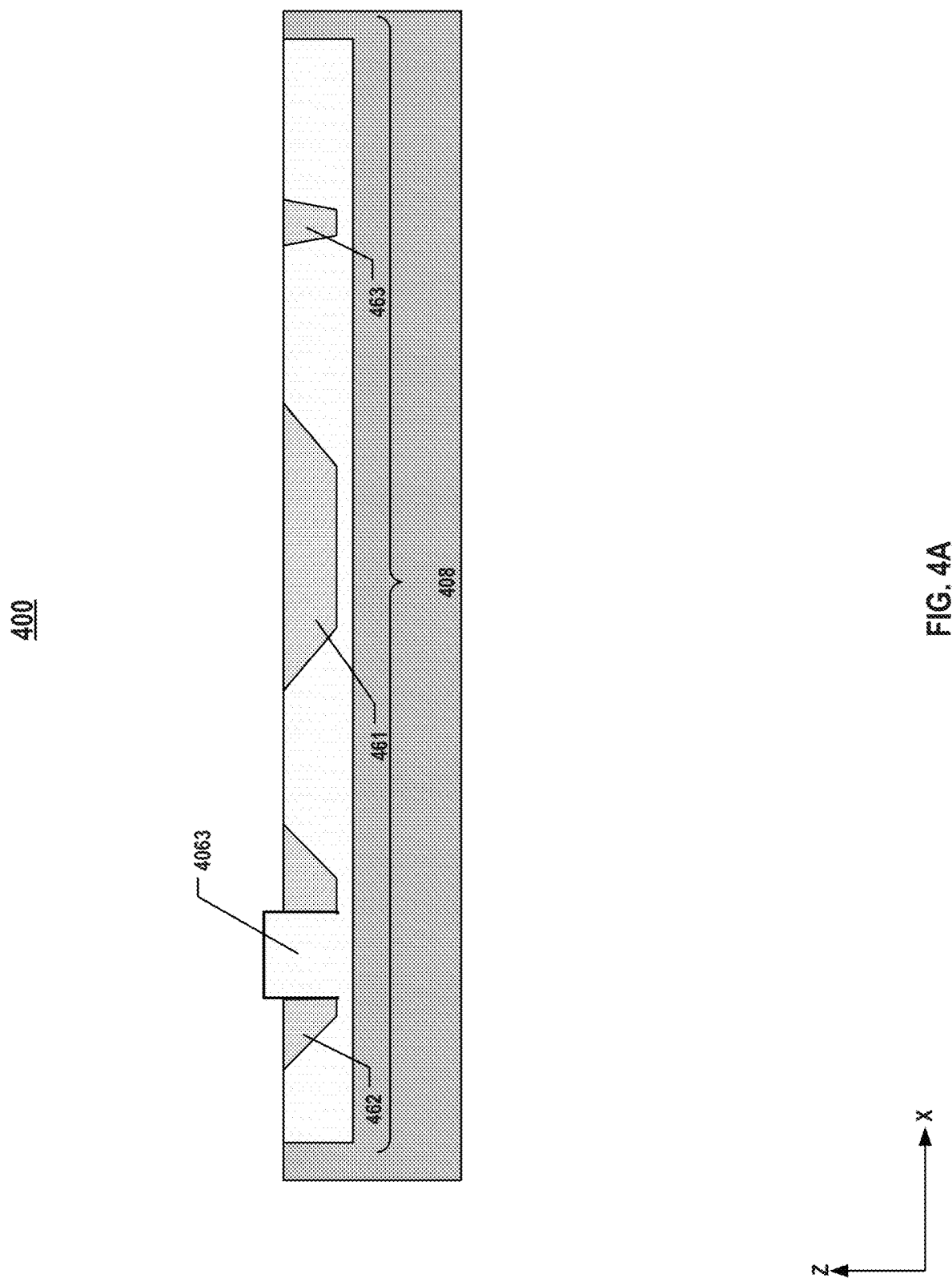
FIGS. 4A-4E illustrate a fabrication process for forming another semiconductor device, according to some aspects of the present disclosure.

Referring to FIG. 6, method 600 starts at operation 602, in which a first trench isolation is formed in a substrate in a first region, and a second trench isolation is formed in the substrate in a second region and surrounding a portion of the substrate. For example, as illustrated in FIG. 4A, trench isolation 461 (corresponding to 261 in FIG. 2B) is formed in substrate 408 (corresponding to 208 in FIG. 2B) in the first region, and trench isolation 462 (corresponding to 262 in FIG. 2B) is formed in substrate 408 surrounding a portion of substrate 408 in the second region. In some implementations, trench isolation 463 (corresponding to 263 in FIG. 2B) is also formed in substrate 408 in a third region. Examples of trench isolation 462 surrounding the portion of substrate 408 in the second region can also be shown in FIG. 2C, where second trench isolation 262 surrounds the portion (part of source 2061 and drain 2062) of the substrate 208. In some implementations, trench isolation 461, 462, or 463 can be STIs, and is formed in a substrate 408, for example, using wet/dry etch and thin film deposition of silicon oxide. The top surface of trench isolation 461, 462, or 463 can be planarized using, for example, chemical mechanical polishing (CMP). Trench isolations 461, 462, or 463 can divide substrate 408 into multiple regions in which multiple transistors can be formed, respectively. In some implementations, the portion of substrate 408 surrounded by second trench isolation 462 is an active region (e.g., 2063 in FIG. 2B) of a transistor 250 (e.g., in FIGS. 2B and 2C).

Figure 4B:
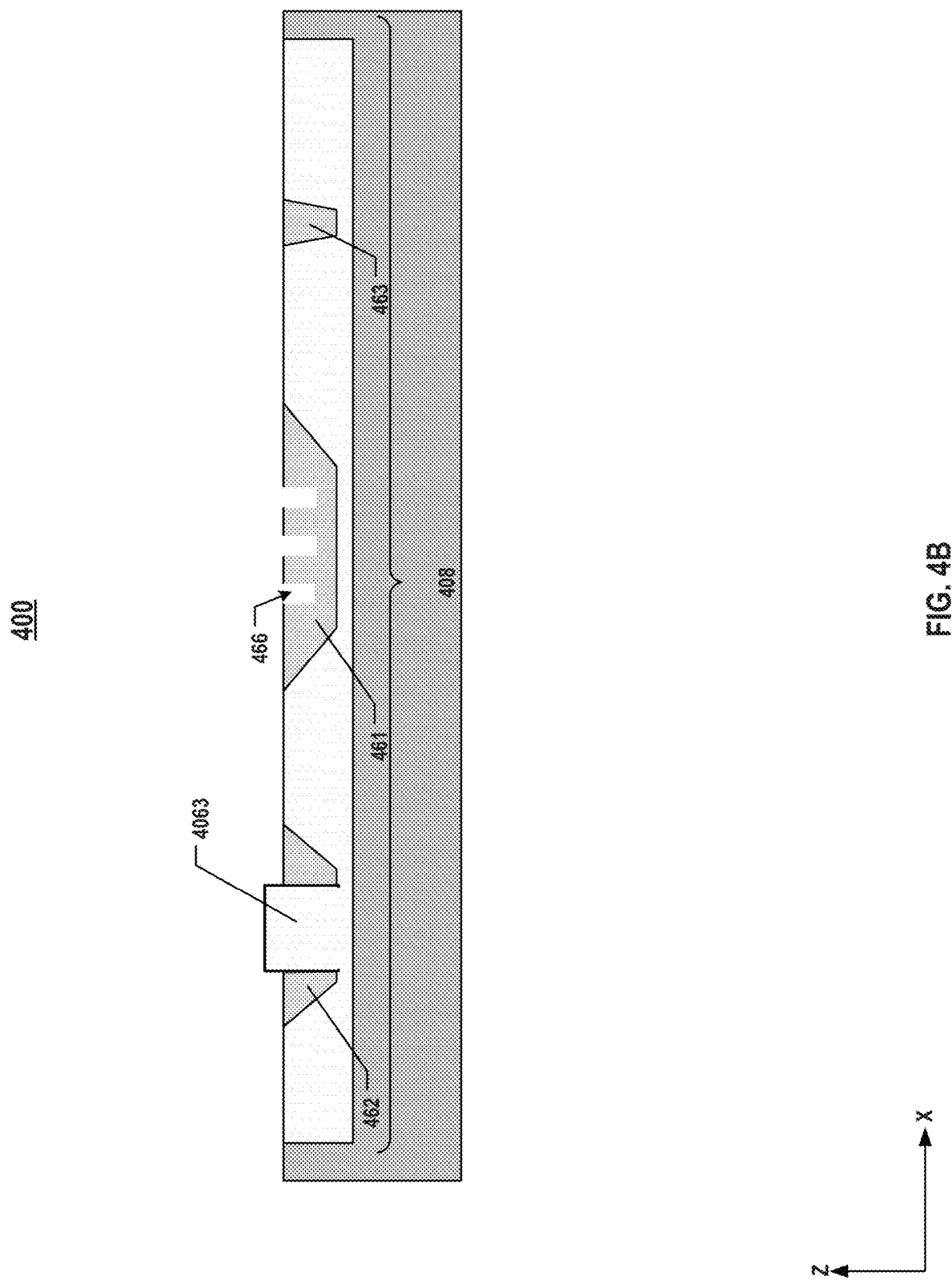
Figure 4C:
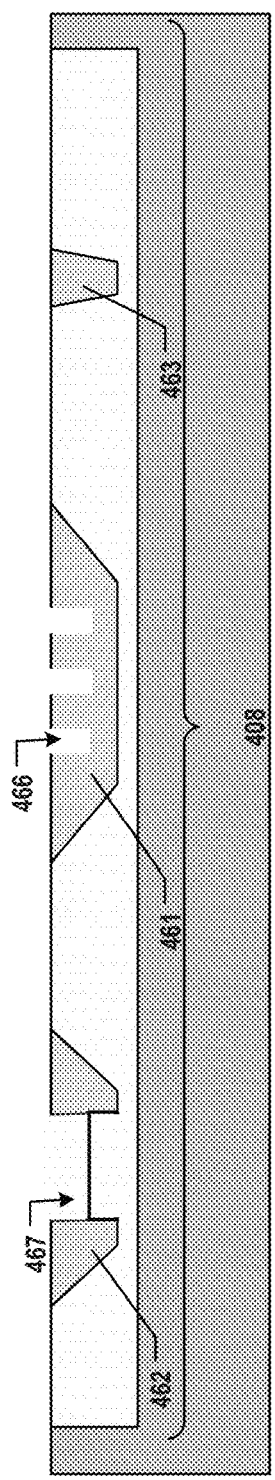

Method 600 proceeds to operation 604, as illustrated in FIG. 6, in which the first trench isolation is etched back to form a first recess in the first trench isolation, and the second trench isolation is etched back to form a second recess in the second trench isolation. For example, as illustrated in FIG. 4B, a first trench isolation 461 is etched back to form a first recess 466 in first trench isolation 461. In some implementations, first recess 466 can be more than one, for example, three first recesses 466 in first trench isolation 461. A second recess 467 of second trench isolation 462, though not shown in FIG. 4B, is illustrated in FIG. 4C, which is a cross-section along a CC plane as in FIG. 2A. Second recess 467 can also be shown as second recess 267 in FIG. 2C in which second recess 267 extends through second trench isolation 262 in they-direction. It is noted that the two recesses 466 (e.g., in FIG. 4B) and 467 (e.g., in FIG. 4C) can be formed in the same operation such that it simplifies the fabrication process for forming the 3D transistor and the routing electrode layer.

Method 600 proceeds to operation 606, as illustrated in FIG. 6, in which an isolation material is deposited to partially fill the second recess to expose at least part of the portion of the substrate to form a 3D semiconductor body. The isolation material, though not shown in FIG. 4C, is illustrated in FIG. 2C as 3D semiconductor body 206 deposited to partially fill second recess 267 to expose at least part of the portion of substrate 208 and extending in they-direction. The part of the portion of substrate 208, as shown in FIG. 2C, is between source 2061, drain 2062 in the y-direction, and surrounded by gate structure 270 in the x-direction. As described above, 3D semiconductor body 206 is formed from substrate 208 or included in substrate 208 and thus, has the same semiconductor material as substrate 208, according to some implementations. In some implementations, 3D semiconductor body 206 includes single crystalline silicon. Since the channels can be formed in 3D semiconductor body 206, 3D semiconductor body 206, as opposed to substrate 208, may be viewed as active region 2063 for 3D transistor 250.

Figure 4D:
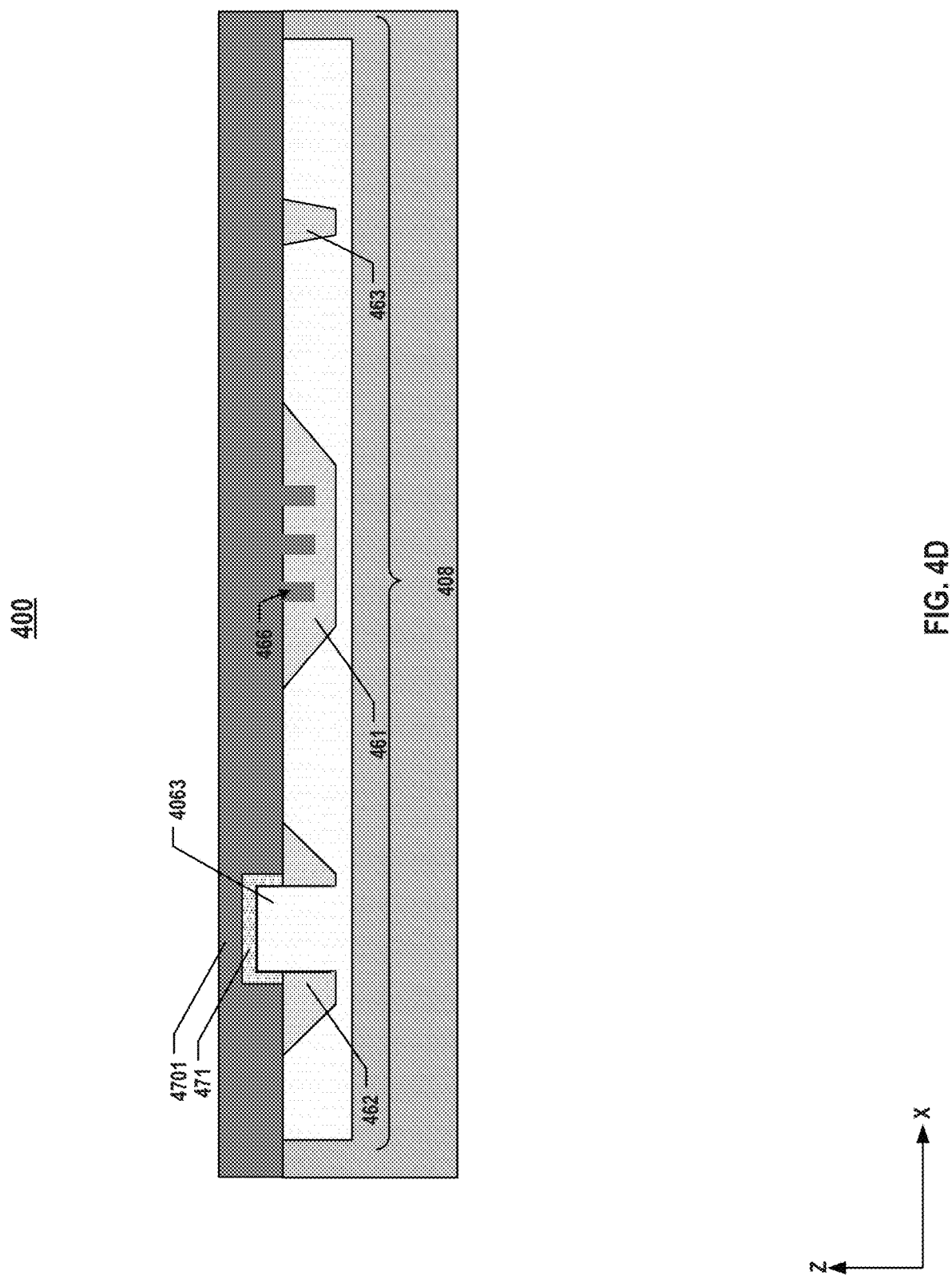

Method 600 proceeds to operation 608, as illustrated in FIG. 6, in which a gate dielectric is formed on the sides of a portion of the 3D semiconductor body. For example, as illustrated in FIG. 4D, gate dielectric 471 is formed on a part of the portion of substrate 408 which can include a 3D semiconductor body. Gate dielectric 471 formed on the part of the portion of substrate 408 can also be illustrated in FIG. 2E, where gate dielectric 271 is formed on a top side and two lateral sides of a portion (e.g., active region 2063) of 3D semiconductor body 206. The gate dielectric can include any suitable dielectric materials, such as silicon oxide, silicon nitride, silicon oxynitride, or high-k dielectrics. In some implementations, the gate dielectric includes silicon oxide, i.e., a gate oxide.

Method 600 proceeds to operation 610, as illustrated in FIG. 6, in which a sacrificial electrode layer is formed on the gate dielectric, the 3D semiconductor body, the first trench isolation, the second trench isolation, and the first recess. For example, as illustrated in FIG. 4D, sacrificial electrode layer 4701 is formed on gate dielectric 471, 3D semiconductor body (not shown), first trench isolation 461, second trench isolation 462, third trench isolation 463, and first recess 466. In some implementations, sacrificial electrode layer 4701 is deposited using one or more thin film deposition processes including, but not limited to, chemical vapor deposition (CVD), physical vapor deposition (PVD), atomic layer deposition (ALD), or any combination thereof. Sacrificial electrode layer 4701 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. In some implementations, sacrificial electrode layer 4701 includes doped polysilicon, i.e., a gate poly.

Figure 4E:
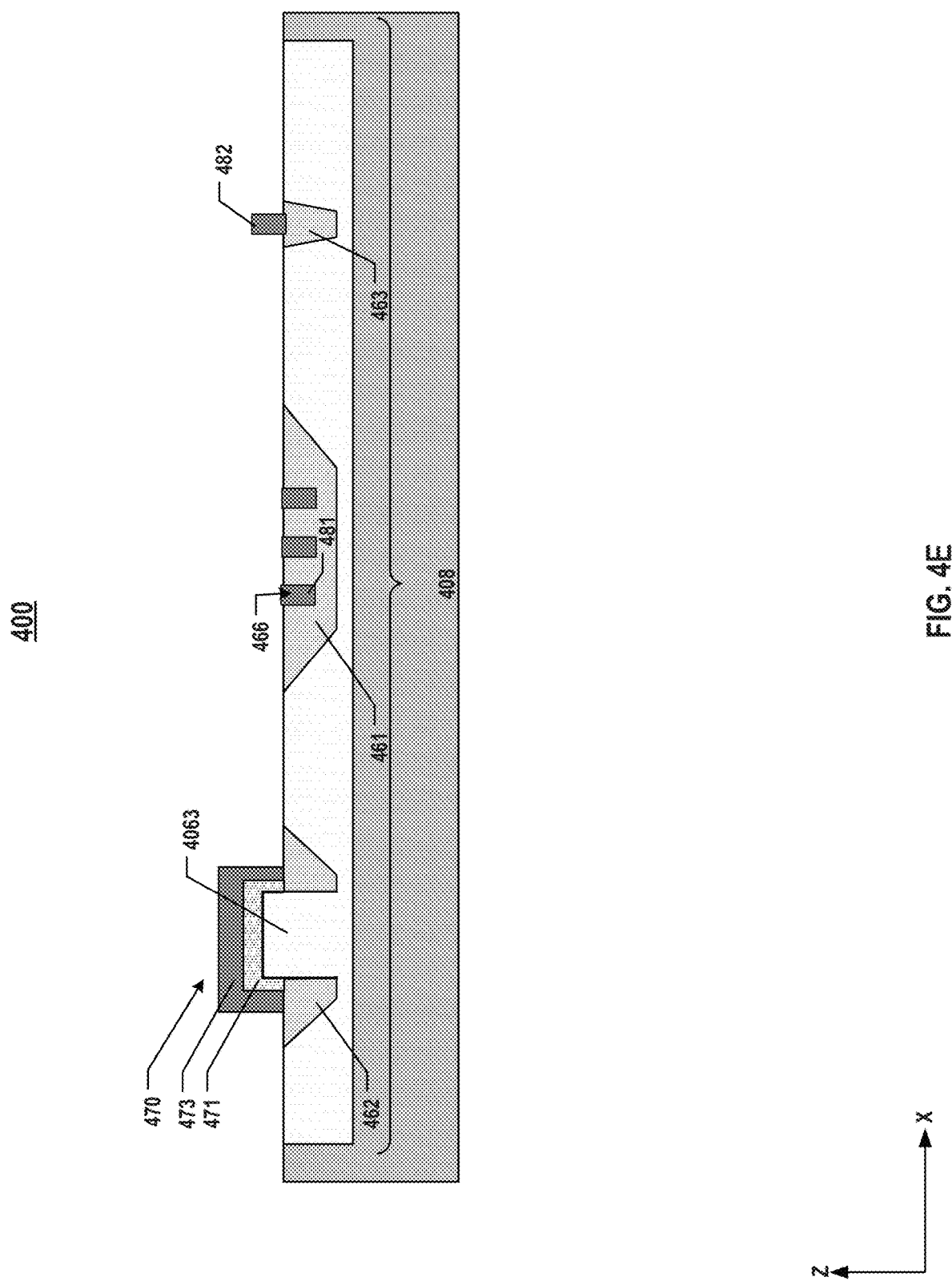

Method 600 proceeds to operation 612, as illustrated in FIG. 6, in which the sacrificial electrode layer is patterned to form a gate electrode layer on the gate dielectric and the second trench isolation to form a gate structure, and a first routing electrode layer in the first recess. For example, as illustrated in FIG. 4E, sacrificial electrode layer 4701 (e.g., in FIG. 4D) is patterned to form gate electrode layer 473 on gate dielectric 471 and second trench isolation 462 to form a gate structure 470, first routing electrode layer 481 in first recess 466, and second routing electrode layer 482 on top surface of third trench isolation 463. In some implementations, gate structure 470 is formed on a top surface of second trench isolation 462 and the portion (e.g., active region 4063) of substrate 408. Examples of gate structure can be shown in FIG. 2C where gate structure 270 is formed on a top surface of second trench isolation 262 and the portion of substrate 208 (which can also be a portion of 3D semiconductor body 206) in the z-direction and separates source 2061 and drain 2062 in y-direction in the plan view. In some implementations, sacrificial electrode layer 4701 (e.g., in FIG. 4D) can be patterned using lithography and wet/dry etch to form gate electrode layer 473. Also, as illustrated in FIG. 4D. In the same operation, sacrificial electrode layer 4701 (e.g., in FIG. 4D) can be patterned using lithography and wet/dry etch to form first routing electrode layer 481 in first recess 466 and second routing electrode layer 482 on the top surface of third trench isolation 463. In some implementations, to form first routing electrode layer 481, second routing electrode layer 482, and gate electrode layer 473 in the same process, a mask (not shown) can be formed on a top surface of sacrificial electrode layer 4701 (e.g., in FIG. 4C) to cover a region where the routing electrode layers 481, 482 and gate electrode layer 473 will be formed, and a wet/dry etch is applied on the mask to pattern sacrificial electrode layer 4701 to expose substrate 408 and trench isolations 461, 462, and 463. As such, in some implementations, the height of gate electrode layer 473 can be the same or similar as that of routing electrode layers 481 and 482. In some implementations, first routing electrode layer 481 can be further planarized by a wet/dry etch to be co-planar with first trench isolation 461, and thus first routing electrode layer 481 is embedded in first recess 466 to avoid interference with other gate structures or routing electrode layers. In some implementations, first routing electrode layer 481 or second routing electrode layer 482 can be coupled to interconnect layer (e.g., 220 in FIG. 2B) and thereby providing additional chip-level metal routing paths. In some implementations, first routing electrode layer 481 or routing electrode layer 482 can be coupled to a bonding contact (e.g., 224 in FIG. 2B) and a bonding layer (e.g., 222 in FIG. 2B) via the interconnect layer.

Method 600 proceeds to operation 614, as illustrated in FIG. 6, in which the 3D semiconductor body that is not covered by the gate structure is doped to form a source and a drain. For example, as illustrated in FIG. 2C, the portion of 3D semiconductor body 206 that is not covered by gate structure 270 is doped to form source 2061 and drain 2062. Source 2061 and drain 2062 can be doped with any suitable P-type dopants, such as boron (B) or Gallium (Ga), or any suitable N-type dopants, such as phosphorus (P) or arsenic (Ar).

Figure 7A:
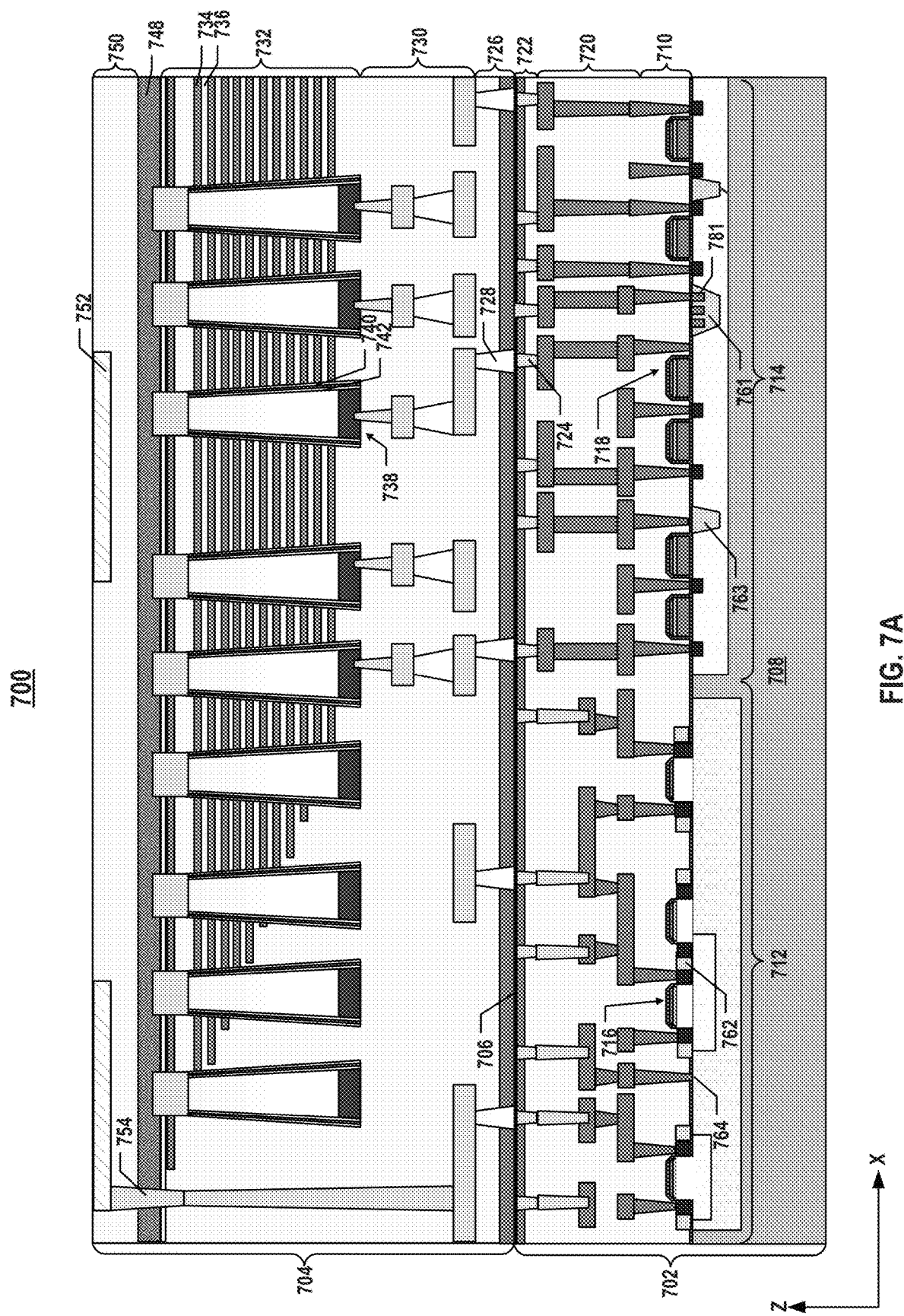
FIG. 7A illustrates a side view of a cross-section of a semiconductor device, according to some aspects of the present disclosure.

FIG. 7A illustrates a side view of a cross-section of an exemplary semiconductor device 700, according to some implementations. Semiconductor device 700 is a bonded chip including a first semiconductor structure 702 and a second semiconductor structure 704 stacked over first semiconductor structure 702. First and second semiconductor structures 702 and 704 are jointed at a bonding interface 706 therebetween, according to some implementations. As shown in FIG. 7A, first semiconductor structure 702 can include a substrate 708, which can include silicon (e.g., single crystalline silicon, c-Si), SiGe, GaAs, Ge, SOI, or any other suitable materials.

First semiconductor structure 702 can include a device layer 710 above substrate 708. In some implementations, device layer 710 includes a first peripheral circuit 712, and a second peripheral circuit 714. In some implementations, first peripheral circuit 712 includes a plurality of 3D transistors 716 (e.g., corresponding to 3D transistor 250 in FIG. 2C), and second peripheral circuit 714 include a plurality of planar transistors 718 (e.g., corresponding to planar transistor 150 in FIG. 1C). Trench isolations 761, 762, and 763 (e.g., STIs corresponding to 161, 162, and 163 in FIG. 1B, or 261, 262, and 263 in FIG. 2B), non-active region 764 (corresponding to 164 in FIG. 1B, or 264 in FIG. 2B), and doped regions (e.g., wells, sources, and drains of transistors 716 and 718) can be formed on or in substrate 708 as well. In some implementations, trench isolation 763 is on substrate 708 and laterally between two adjacent transistors (e.g., planar transistors 718), trench isolation 762 extends into substrate 708 and laterally between two adjacent transistors (e.g., 3D transistors 718), and trench isolation 761 extends into substrate 708 with a plurality of recesses filled with routing electrode layer 781, in the plan view. In some implementations, trench isolation 761, trench isolation 762, and trench isolation 763 have different depths (e.g., the bottom surfaces thereof are in different planes in the z-direction) as they may separate different types of transistors—planar transistors 718 and 3D transistors 716, respectively. For example, as shown in FIG. 7A, trench isolation 762 may have a greater depth than trench isolation 762. It is understood that depending on the different fabrication processes, in some examples, trench isolation 761, trench isolation 762, and trench isolation 763 may have the same depth (e.g., the bottom surfaces thereof are in the same plane in the z-direction). In some implementations, routing electrode layer 781 can be coupled to an interconnect layer 720. In some implementations, non-active region 764 of substrate 708 can also be used for metal routing and coupled to interconnect layer 720. In some implementations, trench isolation 763 can also be coupled to interconnect layer 720 for additional metal routing. It is noted that these trench isolations can be replaced with each other under circumstances with suitable modifications. For one example, trench isolation 762 can be extended laterally to form the plurality of recesses filled with routing electrode layer 781. For another example, trench isolation 763 can also be extended laterally to form the plurality of recesses filled with routing electrode layer 781.

In some implementations, first semiconductor structure 702 further includes an interconnect layer 720 above device layer 710 to transfer electrical signals to and from peripheral circuits 712 and 714. Interconnect layer 720 can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. Interconnect layer 720 can further include one or more interlayer dielectric (ILD) layers (also known as "intermetal dielectric (IMD) layers") in which the interconnect lines and via contacts can form. That is, interconnect layer 720 can include interconnect lines and via contacts in multiple ILD layers. In some implementations, the devices in device layer 710 are coupled to one another through the interconnects in interconnect layer 720. For example, peripheral circuit 712 may be coupled to peripheral circuit 714 through interconnect layer 720.

As shown in FIG. 7A, first semiconductor structure 702 can further include a bonding layer 722 (corresponding to 122 in FIG. 1B, or 222 in FIG. 2B) at bonding interface 706 and above interconnect layer 720 and device layer 710. Bonding layer 722 can include a plurality of bonding contacts 724 (corresponding to 124 in FIG. 1B, or 224 in FIG. 2B) and dielectrics electrically isolating bonding contacts 724. Bonding contacts 724 can include conductive materials. The remaining area of bonding layer 722 can be formed with dielectric materials. Bonding contacts 724 and surrounding dielectrics in bonding layer 722 can be used for hybrid bonding. Similarly, as shown in FIG. 7A, second semiconductor structure 704 can also include a bonding layer 726 at bonding interface 706 and above bonding layer 722 of first semiconductor structure 702. Bonding layer 726 can include a plurality of bonding contacts 728 and dielectrics electrically isolating bonding contacts 728. Bonding contacts 728 can include conductive materials. The remaining area of bonding layer 726 can be formed with dielectric materials. Bonding contacts 728 and surrounding dielectrics in bonding layer 726 can be used for hybrid bonding. Bonding contacts 728 are in contact with bonding contacts 724 at bonding interface 706, according to some implementations.

Second semiconductor structure 704 can be bonded on top of first semiconductor structure 702 in a face-to-face manner at bonding interface 706. In some implementations, bonding interface 706 is disposed between bonding layers 722 and 726 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 706 is the place at which bonding layers 722 and 726 are met and bonded. In practice, bonding interface 706 can be a layer with a certain thickness that includes the top surface of bonding layer 722 of first semiconductor structure 702 and the bottom surface of bonding layer 726 of second semiconductor structure 704.

In some implementations, second semiconductor structure 704 further includes an interconnect layer 730 above bonding layer 726 to transfer electrical signals. Interconnect layer 730 can include a plurality of interconnects, such as MEOL interconnects and BEOL interconnects. In some implementations, the interconnects in interconnect layer 730 also include local interconnects, such as bit line contacts and word line contacts. Interconnect layer 730 can further include one or more ILD layers in which the interconnect lines and via contacts can form.

In some implementations, second semiconductor structure 704 includes a NAND Flash memory device in which memory cells are provided in the form of an array of 3D NAND memory strings 738 above interconnect layer 730 and bonding layer 726. Each 3D NAND memory string 738 extends vertically through a plurality of pairs each including a conductive layer 734 and a dielectric layer 736, according to some implementations. The stacked and interleaved conductive layers 734 and dielectric layer 736 are also referred to herein as a stack structure, e.g., a memory stack 732. Interleaved conductive layers 734 and dielectric layers 736 in memory stack 732 alternate in the vertical direction, according to some implementations. Each conductive layer 734 can include a gate electrode layer (gate line) surrounded by an adhesive layer and a gate dielectric layer. The gate electrode layer of stack conductive layer 734 can extend laterally as a word line, ending at one or more staircase structures of memory stack 732.

In some implementations, each 3D NAND memory string 738 is a "charge trap" type of NAND memory string including a semiconductor channel 742 and a memory film 740. In some implementations, semiconductor channel 742 includes silicon, such as amorphous silicon, polysilicon, or single crystalline silicon. In some implementations, memory film 740 is a composite dielectric layer including a tunneling layer, a storage layer (also known as "charge trap/storage layer"), and a blocking layer. Each 3D NAND memory string 738 can have a cylinder shape (e.g., a pillar shape). Semiconductor channel 742, the tunneling layer, the storage layer, and the blocking layer of memory film 740 are arranged along a direction from the center toward the outer surface of the pillar in this order, according to some implementations. In some implementations, 3D NAND memory strings 738 further include a plurality of control gates (each being part of a word line). Each conductive layer 734 in memory stack 732 can act as a control gate for each memory cell of 3D NAND memory string 738.

In some implementations, second semiconductor structure 704 further includes a semiconductor layer 748 disposed above memory stack 732 and 3D NAND memory strings 738. Semiconductor layer 748 can be a thinned substrate on which memory stack 732 and 3D NAND memory strings 738 are formed. In some implementations, semiconductor layer 748 includes single crystalline silicon. Semiconductor layer 748 can also include isolations and doped regions (e.g., functioning as an array common source (ACS) for 3D NAND memory strings 738, not shown). It is understood that 3D NAND memory strings 738 are not limited to the "charge trap" type of 3D NAND memory strings and may be "floating gate" type of 3D NAND memory strings in other examples. Semiconductor layer 748 may include polysilicon as the source plate of the "floating gate" type of 3D NAND memory strings.

As shown in FIG. 7A, second semiconductor structure 704 can further include a pad-out interconnect layer 750 above semiconductor layer 748. Pad-out interconnect layer 750 can include interconnects, e.g., contact pads 752, in one or more ILD layers. Pad-out interconnect layer 750 and interconnect layer 730 can be formed at opposite sides of semiconductor layer 748. In some implementations, the interconnects in pad-out interconnect layer 750 can transfer electrical signals between semiconductor device 700 and outside circuits, e.g., for pad-out purposes. In some implementations, second semiconductor structure 704 further includes one or more contacts 754 extending through semiconductor layer 748 to electrically connect pad-out interconnect layer 750 and interconnect layers 730 and 720. As a result, peripheral circuits 712 and 714 can be coupled to array of 3D NAND memory strings 738 through interconnect layers 730 and 720 as well as bonding contacts 728 and 724. That is, array of 3D NAND memory strings 738 can be coupled to 3D transistors 716 and planar transistors 718 across bonding interface 706. Moreover, peripheral circuits 712 and 714 and array of 3D NAND memory strings 738 can be coupled to outside circuits through contacts 754 and pad-out interconnect layer 750.

Figure 7B:
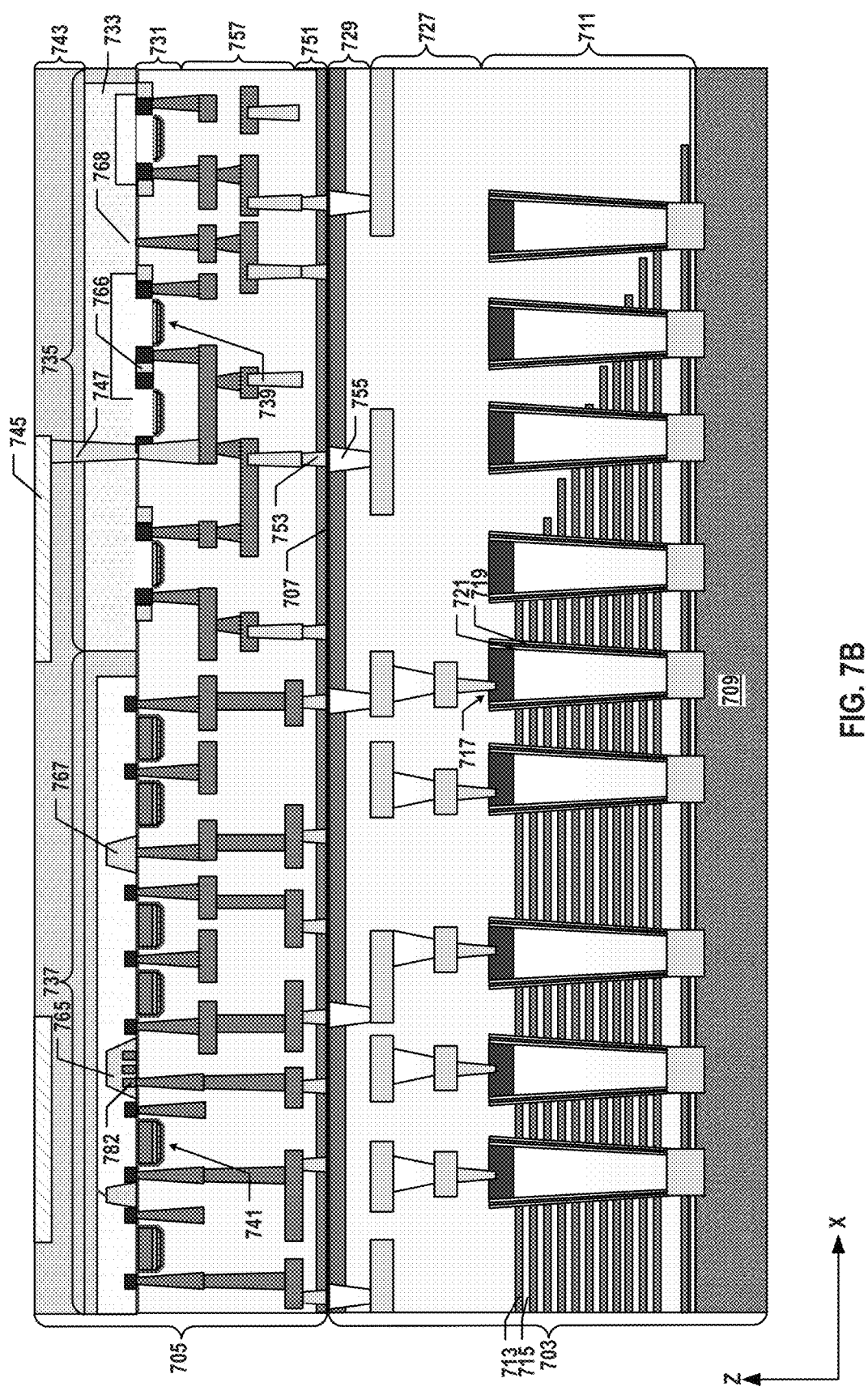
FIG. 7B illustrates a side view of a cross-section of another semiconductor device, according to some aspects of the present disclosure.

FIG. 7B illustrates a cross-section of another exemplary semiconductor device 701, according to some aspects of the present disclosure. Semiconductor device 701 is a bonded chip including a second semiconductor structure 703 and a first semiconductor structure 705 stacked over second semiconductor structure 703. Similar to semiconductor device 700 described above in FIG. 7A, semiconductor device 701 represents an example of a bonded chip in which first semiconductor structure 705 and second semiconductor structure 703 are formed separately and bonded in a face-to-face manner at a bonding interface 707. It is understood that the details of similar structures (e.g., materials, fabrication process, functions, etc.) in both semiconductor devices 700 and 701 may not be repeated below.

Second semiconductor structure 703 can include a substrate 709 and a memory stack 711 including interleaved conductive layers 713 and dielectric layers 715 above substrate 709. In some implementations, an array of 3D NAND memory strings 717 each extends vertically through interleaved conductive layers 713 and dielectric layers 715 in memory stack 711 above substrate 709. Each 3D NAND memory string 717 can include a semiconductor channel 721 and a memory film 719. 3D NAND memory strings 717 can be "charge trap" type of 3D NAND memory strings or "floating gate" type of 3D NAND memory strings.

In some implementations, second semiconductor structure 703 also includes an interconnect layer 727 above memory stack 711 and 3D NAND memory strings 717 to transfer electrical signals to and from 3D NAND memory strings 717. Interconnect layer 727 can include a plurality of interconnects, including interconnect lines and via contacts. In some implementations, the interconnects in interconnect layer 727 also include local interconnects, such as bit line contacts and word line contacts. In some implementations, second semiconductor structure 703 further includes a bonding layer 729 at bonding interface 707 and above interconnect layer 727 and memory stack 711 and 3D NAND memory strings 717. Bonding layer 729 can include a plurality of bonding contacts 755 and dielectrics surrounding and electrically isolating bonding contacts 755.

As shown in FIG. 7B, first semiconductor structure 705 includes another bonding layer 751 at bonding interface 707 and above bonding layer 729. Bonding layer 751 can include a plurality of bonding contacts 753 and dielectrics surrounding and electrically isolating bonding contacts 753. Bonding contacts 753 are in contact with bonding contacts 755 at bonding interface 707, according to some implementations. In some implementations, first semiconductor structure 705 also includes an interconnect layer 757 above bonding layer 751 to transfer electrical signals. Interconnect layer 757 can include a plurality of interconnects, including interconnect lines and via contacts.

First semiconductor structure 705 can further include a device layer 731 above interconnect layer 757 and bonding layer 751. In some implementations, device layer 731 includes a first peripheral circuit and a second peripheral circuit 714. In some implementations, peripheral circuit 735 includes a plurality of 3D transistors 739 (e.g., corresponding to 3D transistor 250), and peripheral circuit 737 includes a plurality of planar transistors 741 (e.g., corresponding to planar transistor 150). Trench isolations 765, 766, and 767 (e.g., STIs corresponding to 161, 162, and 163 in FIG. 1B, or 261, 262, and 263 in FIG. 2B), non-active region 768 (e.g., corresponding to 164 in FIG. 1B, or 264 in FIG. 2B), and doped regions (e.g., wells, sources, and drains of transistors 739 and 741) can be formed on or in a semiconductor layer 733 (e.g., a thinned substrate) as well. In some implementations, trench isolation 766 is below semiconductor layer 733 and laterally between two adjacent 3D transistors 739, trench isolation 767 extends into semiconductor layer 733 and laterally between two adjacent planar transistors 741, and trench isolation 765 extends into semiconductor layer 733 with a plurality of recesses filled with routing electrode layer 782, in the plan view. In some implementations, trench isolation 765, trench isolation 766, and trench isolation 767 have different depths (e.g., the top surfaces thereof are in different planes in the z-direction) as they may separate different types of transistors—planar transistors 741 and 3D transistors 739, respectively. For example, as shown in FIG. 7B, trench isolation 767 may have a greater depth than trench isolation 766. It is understood that depending on the different fabrication processes, in some examples, trench isolation 765, trench isolation 766, and trench isolation 767 have the same depth (e.g., the top surfaces thereof are in the same plane in the z-direction). In some implementations, routing electrode layer 782 can be coupled to an interconnect layer 757. In some implementations, non-active region 768 of substrate 708 can also be used for metal routing and coupled to interconnect layer 757. In some implementations, trench isolation 767 is coupled to interconnect layer 757 for additional metal routing. It is noted that these trench isolations can be replaced with each other under circumstances with suitable modifications. For one example, trench isolation 767 can be extended laterally to form the plurality of recesses filled with routing electrode layer (e.g., routing electrode layer 782). For another example, trench isolation 766 can also be extended laterally to form the plurality of recesses filled with routing electrode layer (e.g., routing electrode layer 782).

In some implementations, first semiconductor structure 705 further includes semiconductor layer 733 disposed above device layer 731. Semiconductor layer 733 can be above and in contact with peripheral circuits 735 and 737. Semiconductor layer 733 can be a thinned substrate on which transistors 739 and 741 are formed. In some implementations, semiconductor layer 733 includes single crystalline silicon. Semiconductor layer 733 can also include isolations and doped regions.

As shown in FIG. 7B, first semiconductor structure 705 can further include a pad-out interconnect layer 743 above semiconductor layer 733. Pad-out interconnect layer 743 can include interconnects, e.g., contact pads 745, in one or more ILD layers. In some implementations, the interconnects in pad-out interconnect layer 743 can transfer electrical signals between semiconductor device 701 and outside circuits, e.g., for pad-out purposes. In some implementations, first semiconductor structure 705 further includes one or more contacts 747 extending through semiconductor layer 733 to couple pad-out interconnect layer 743 and interconnect layers 757 and 727. As a result, peripheral circuits 735 and 737 can also be coupled to array of 3D NAND memory strings 717 through interconnect layers 757 and 727 as well as bonding contacts 753 and 755. That is, array of 3D NAND memory strings 717 can be coupled to 3D transistors 739 and planar transistors 741 across bonding interface 707. Moreover, peripheral circuits 735 and 737 and array of 3D NAND memory strings 717 can be electrically connected to outside circuits through contacts 747 and pad-out interconnect layer 743.

FIG. 8 illustrates a block diagram of a system 800 having a semiconductor device, according to some aspects of the present disclosure. System 800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 8, system 800 can include a host 808 and a memory system 802 having one or more semiconductor devices 804 and a memory controller 806. Host 808 can be a processor of an electronic device, such as a central processing unit (CPU), or a system-on-chip (SoC), such as an application processor (AP). Host 808 can be configured to send or receive the data to or from semiconductor devices 804.

Semiconductor device 804 can be any semiconductor devices disclosed herein, such as semiconductor devices 100 and 200, semiconductor devices 700, and 701. In some implementations, each semiconductor device 804 includes a peripheral circuit having a planar transistor or a 3D transistor, as described above in detail.

Memory controller 806 is coupled to semiconductor device 804 and host 808 and is configured to control semiconductor device 804, according to some implementations. Memory controller 806 can manage the data stored in semiconductor device 804 and communicate with host 808. In some implementations, memory controller 806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 806 can be configured to control operations of semiconductor device 804, such as read, erase, and program operations. Memory controller 806 can also be configured to manage various functions with respect to the data stored or to be stored in semiconductor device 804 including, but not limited to bad-block management, garbage collection, logical-to-physical address conversion, wear leveling, etc. In some implementations, memory controller 806 is further configured to process error correction codes (ECCs) with respect to the data read from or written to semiconductor device 804. Any other suitable functions may be performed by memory controller 806 as well, for example, formatting semiconductor device 804. Memory controller 806 can communicate with an external device (e.g., host 808) according to a particular communication protocol. For example, memory controller 806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 806 and one or more semiconductor devices 804 can be integrated into various types of storage devices, for example, be included in the same package, such as a universal Flash storage (UFS) package or an eMMC package. That is, memory system 802 can be implemented and packaged into different types of end electronic products. In one example as shown in FIG. 9A, memory controller 806 and a single semiconductor device 804 may be integrated into a memory card 902. Memory card 902 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 902 can further include a memory card connector 904 coupling memory card 902 with a host (e.g., host 808 in FIG. 8). In another example as shown in FIG. 9B, memory controller 806 and multiple semiconductor devices 804 may be integrated into an SSD 906. SSD 906 can further include an SSD connector 908 coupling SSD 906 with a host (e.g., host 808 in FIG. 8). In some implementations, the storage capacity and/or the operation speed of SSD 906 is greater than those of memory card 902.

According to one aspect of the present disclosure, a semiconductor device includes a substrate, a first trench isolation in the substrate, a second trench isolation in the substrate and surrounding a portion of the substrate, and a first routing electrode layer extending through the first trench isolation. The portion of the substrate is an active region of a transistor.

In some implementations, the semiconductor device further includes a third trench isolation on the substrate, and a second routing electrode layer on the third trench isolation.

In some implementations, the semiconductor device further includes a non-active region on the substrate, and a third routing electrode layer on the non-active region.

In some implementations, the semiconductor device further includes an interconnect layer coupled to the first routing electrode layer.

In some implementations, the semiconductor device further includes a first peripheral circuit comprising the transistor, and a second peripheral circuit. The first peripheral circuit is coupled to the second peripheral circuit through the interconnect layer.

In some implementations, the transistor includes a planar transistor or a 3D transistor.

In some implementations, the 3D transistor includes a 3D semiconductor body, and a gate structure in contact with one side of the 3D semiconductor body. The gate structure includes a gate dielectric and a gate electrode.

In some implementations, the 3D semiconductor body extends through the second trench isolation.

In some implementations, the 3D semiconductor body includes the portion of the substrate, a source, and a drain. The portion of the substrate is formed between the source and the drain.

In some implementations, the planar transistor includes a source, a drain, and a gate structure in contact with the portion of the substrate. The gate structure includes a gate dielectric and a gate electrode. The portion of the substrate is surrounded by the source and the drain.

In some implementations, the gate electrode includes polysilicon.

In some implementations, the gate dielectric includes silicon oxide.

In some implementations, the first routing electrode layer includes polysilicon.

In some implementations, the first peripheral circuit includes a 3D transistor. The second peripheral circuit includes a planar transistor.

In some implementations, the semiconductor device further includes an array of 3D NAND memory strings, and a bonding layer. The array of 3D NAND memory strings is coupled to the first peripheral circuit or the second peripheral circuit through the bonding layer and the interconnect layer.

According to another aspect of the present disclosure, a system includes a memory device and a memory controller. The memory device includes a first peripheral circuit, an array of memory strings, and a bonding layer. The first peripheral circuit includes a first transistor. The first transistor includes a substrate, a first trench isolation in the substrate, a second trench isolation in the substrate and surrounding a portion of the substrate, a first routing electrode layer extending through the first trench isolation, and an interconnect layer coupled to the routing electrode layer. The portion of the substrate is an active region of the first transistor. The array of memory strings is coupled to the first peripheral circuit through the bonding layer and the interconnect layer. The memory controller is coupled to the memory device and configured to control the array of memory strings through the first peripheral circuit.

In some implementations, the system further includes a host coupled to the memory controller and configured to send or receive data.

In some implementations, the memory device further includes a second peripheral circuit. The second peripheral circuit includes a second transistor. The second peripheral circuit is coupled to the first peripheral circuit or the array of memory strings through the bonding layer and the interconnect layer.

In some implementations, the first transistor is a 3D transistor, and the second transistor is a planar transistor.

In some implementations, the array of memory strings includes an array of 3D NAND memory strings.

According to still another aspect of the present disclosure, a method for forming a semiconductor device includes forming a first trench isolation in a substrate in a first region and a second trench isolation in the substrate surrounding a portion of the substrate in a second region, etching back the first trench isolation to form a recess in the first trench isolation, forming a gate dielectric on part of the portion of the substrate, forming a sacrificial electrode layer on the gate dielectric, the portion of the substrate, the first trench isolation, the second trench isolation, and the recess; and patterning the sacrificial electrode layer to form a gate electrode on the gate dielectric and the second trench isolation to form a gate structure, and a first routing electrode layer in the recess.

In some implementations, the method further includes doping the portion of the substrate in the second region that is not covered by the gate structure to form a source and a drain.

In some implementations, the method further includes forming a third trench isolation in the substrate in a third region and patterning the sacrificial electrode layer to form a second routing layer on a top surface of the third trench isolation.

In some implementations, a height of gate electrode layer is the same or similar as that of the first routing electrode layer.

In some implementations, the method further includes planarizing the first routing electrode layer by a wet etch or a dry etch to be co-planar with the first trench isolation.

In some implementations, the first routing electrode layer is coupled to an interconnect layer.

In some implementations, the first routing electrode layer is coupled to a bonding contact and a bonding layer via the interconnect layer.

According to yet another aspect of the present disclosure, a method for forming a semiconductor device includes forming a first trench isolation in a substrate in a first region and a second trench isolation in the substrate surrounding a portion of the substrate in a second region, etching back the first trench isolation to form a first recess in the first trench isolation and etching back the second trench isolation to form a second recess in the second trench isolation, depositing an isolation material to partially fill the second recess to expose at least part of the portion of the substrate to form a 3D semiconductor body, forming a gate dielectric on sides of a portion of the 3D semiconductor body, forming a sacrificial electrode layer on the gate dielectric, the 3D semiconductor body, the first trench isolation, the second trench isolation, and the first recess, and patterning the sacrificial electrode layer to form a gate electrode on the gate dielectric and the second trench isolation to form a gate structure, and a first routing electrode layer in the first recess.

In some implementations, the method further includes doping the 3D semiconductor body in the second region that is not covered by the gate structure to form a source and a drain.

In some implementations, the method further includes forming a third trench isolation in the substrate in a third region and patterning the sacrificial electrode layer to form a second routing layer on a top surface of the third trench isolation.

In some implementations, a height of gate electrode layer is the same or similar as that of the first routing electrode layer.

In some implementations, the method further includes planarizing the first routing electrode layer by a wet etch or a dry etch to be co-planar with the first trench isolation.

In some implementations, the first routing electrode layer is coupled to an interconnect layer.

In some implementations, the first routing electrode layer is coupled to a bonding contact and a bonding layer via the interconnect layer.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:
   a substrate;
   a first trench isolation in the substrate;
   a second trench isolation in the substrate and surrounding a portion of the substrate, wherein the portion of the substrate is an active region of a three-dimensional (3D) transistor, wherein the 3D transistor comprises a 3D semiconductor body extending through the second trench isolation; and
   a first routing electrode layer extending through the first trench isolation.

2. The semiconductor device of claim 1, further comprising:
   a third trench isolation on the substrate; and
   a second routing electrode layer on the third trench isolation.

3. The semiconductor device of claim 1, further comprising:
   a non-active region on the substrate; and
   a third routing electrode layer on the non-active region.

4. The semiconductor device of claim 1, further comprising:
   an interconnect layer coupled to the first routing electrode layer.

5. The semiconductor device of claim 4, further comprising:
   a first peripheral circuit comprising the 3D transistor; and
   a second peripheral circuit, wherein the first peripheral circuit is coupled to the second peripheral circuit through the interconnect layer.

6. The semiconductor device of claim 5, wherein the second peripheral circuit comprises a planar transistor or a second 3D transistor.

7. The semiconductor device of claim 6, wherein the 3D transistor further comprises:
   a gate structure in contact with a side of the 3D semiconductor body, wherein the gate structure comprises a gate dielectric and a gate electrode.

8. The semiconductor device of claim 7, wherein the 3D semiconductor body comprises:
   the portion of the substrate;
   a source; and
   a drain, wherein the portion of the substrate is formed between the source and the drain.

9. The semiconductor device of claim 6, wherein the planar transistor comprises:
   a source;
   a drain;

a channel surrounded by the source and the drain; and a gate structure comprising a gate dielectric and a gate electrode.

10. The semiconductor device of claim 5, further comprising:

an array of 3D NAND memory strings; and a bonding layer, wherein the array of 3D NAND memory strings is coupled to the first peripheral circuit or the second peripheral circuit through the bonding layer and the interconnect layer.

11. A semiconductor device, comprising:

a semiconductor layer;

a first trench isolation at least partially embedded in the semiconductor layer;

a first routing electrode layer at least partially embedded in the first trench isolation;

a second trench isolation at least partially embedded in the semiconductor layer; and a three-dimensional (3D) transistor comprising a 3D semiconductor body extending through the second trench isolation, wherein the 3D semiconductor body is a first portion of the semiconductor layer laterally surrounded by the second trench isolation and has a first top surface higher than a second top surface of a second portion of the semiconductor layer outside of the second trench isolation.

12. The semiconductor device of claim 11, further comprising:

a third trench isolation at least partially embedded in the semiconductor layer; and a second routing electrode layer on the third trench isolation.

13. The semiconductor device of claim 12, wherein the first portion of the semiconductor layer comprises an active region of the 3D transistor; and the second portion of the semiconductor layer comprises a non-active region on which a third routing electrode layer is located.

14. The semiconductor device of claim 13, further comprising:

an interconnect layer coupled to the first routing electrode layer, the second routing electrode layer, and the third routing electrode layer.

15. The semiconductor device of claim 14, further comprising:

a first peripheral circuit comprising the 3D transistor; and a second peripheral circuit, wherein the first peripheral circuit is coupled to the second peripheral circuit through the interconnect layer.

16. The semiconductor device of claim 15, wherein the second peripheral circuit comprises a planar transistor or a second 3D transistor.

17. The semiconductor device of claim 16, wherein the 3D transistor further comprises:

a gate structure in contact with a side of the 3D semiconductor body, wherein the gate structure comprises a gate dielectric and a gate electrode.

18. The semiconductor device of claim 17, wherein the 3D semiconductor body comprises:

the active region;

a source on a first side of the active region; and a drain on a second side of the active region opposite to the first side.

19. The semiconductor device of claim 16, wherein the planar transistor comprises:

a source;

a drain;

a channel surrounded by the source and the drain; and a gate structure comprising a gate dielectric and a gate electrode.

20. The semiconductor device of claim 15, further comprising:

an array of 3D NAND memory strings; and a bonding layer, wherein the array of 3D NAND memory strings is coupled to the first peripheral circuit or the second peripheral circuit through the bonding layer and the interconnect layer.

* * * * *